US007235456B2

(12) United States Patent
Sato et al.

(10) Patent No.: US 7,235,456 B2
(45) Date of Patent: Jun. 26, 2007

(54) METHOD OF MAKING EMPTY SPACE IN SILICON

(75) Inventors: Tsutomu Sato, Yokohama (JP); Mie Matsuo, Kamakura (JP); Ichiro Mizushima, Yokohama (JP); Yoshitaka Tsunashima, Yokohama (JP); Shinichi Takagi, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 11/340,594

(22) Filed: Jan. 27, 2006

(65) Prior Publication Data
US 2006/0131651 A1 Jun. 22, 2006

Related U.S. Application Data

(62) Division of application No. 09/650,748, filed on Aug. 30, 2000, now Pat. No. 7,019,364.

(30) Foreign Application Priority Data

Aug. 31, 1999 (JP) .............................. 11-246582
Aug. 23, 2000 (JP) .............................. 2000-252881

(51) Int. Cl.
*H01L 21/764* (2006.01)
*H01L 27/12* (2006.01)

(52) U.S. Cl. ...................... 438/411; 438/422; 257/522; 257/E21.564; 257/E21.573

(58) Field of Classification Search ............... 438/405, 438/479, 411–412, 421–422
See application file for complete search history.

(56) References Cited

U.S. PATENT DOCUMENTS

| 4,888,300 | A | | 12/1989 | Burton |
| 5,466,630 | A | * | 11/1995 | Lur .............................. 438/407 |
| 5,972,758 | A | * | 10/1999 | Liang .......................... 438/294 |
| 6,100,132 | A | | 8/2000 | Sato et al. |
| 6,383,924 | B1 | * | 5/2002 | Farrar et al. ................. 438/667 |
| 6,552,380 | B1 | | 4/2003 | Sato et al. |
| 6,570,217 | B1 | * | 5/2003 | Sato et al. ................... 257/327 |
| 6,582,512 | B2 | * | 6/2003 | Geusic et al. ................... 117/3 |
| 6,630,714 | B2 | * | 10/2003 | Sato et al. ................... 257/350 |
| 7,009,273 | B2 | * | 3/2006 | Inoh et al. ................... 257/522 |

FOREIGN PATENT DOCUMENTS

| JP | 60-150644 | 8/1985 |
| JP | 63-278375 | 11/1988 |
| JP | 1-128442 | 5/1989 |

(Continued)

OTHER PUBLICATIONS

M. Kito et al., U.S. Appl. No. 09/549,513, entitled "Semiconductor Device and Manufacturing Method Thereof," Apr. 14, 2000.

(Continued)

*Primary Examiner*—Anh Duy Mai
(74) *Attorney, Agent, or Firm*—Finnegan, Henderson, Farabow, Garrett & Dunner, L.L.P.

(57) ABSTRACT

To change a plurality of trenches to one flat empty space by two-dimensionally forming the trenches on the surface of a semiconductor substrate and then applying heat treatment to the semiconductor substrate.

26 Claims, 28 Drawing Sheets

FOREIGN PATENT DOCUMENTS

| | | | |
|---|---|---|---|
| JP | 2-280381 | | 11/1990 |
| JP | 4-304653 | | 10/1992 |
| JP | 4-329676 | | 11/1992 |
| JP | 6-125000 | | 5/1994 |
| JP | 9-321307 | | 12/1997 |
| JP | 10-256362 | | 9/1998 |
| JP | 2000-012858 | * | 1/2000 |
| JP | 2000-58780 | | 2/2000 |

OTHER PUBLICATIONS

T. Sato et al., "A New Substrate Engineering for the Formation of Empty Space in Silicon (ESS) Induced by Silicon Surface Migration," IEDM Tech. Digest, pp. 517-520, (1999).

T. Sato et al., "Trench Transformation Technology Using Hydrogen Annealing for Realizing Highly Reliable Device Structure With ThinDielectric Films," VLSI Tech. Digest of Technical Papers, pp. 206-207, (1998).

S. Matsuda et al., "Novel Corner Rounding Process for Shallow Trench Isolation Utilizing MSTS (Micro-Structure Transformation of Silicon)," IEDM Tech. Digest, pp. 137-140, (1998).

T. Sato et al., "A New Substrate Engineering for the Formation of Empty Space in Silicon (ESS) Induced by Silicon Surface Migration," The Japan Society of Applied Physics, Silicon Technology, No. 14, pp. 61-65 (2000).

K. Mitsutake et al., "Theoretical Study on the Formation Process of Empty Space in Silicon," Extended Abstracts (The 47$^{th}$ Spring Meeting 2000), The Japan Society of Applied Physics and Related Societies, 31a-YK-8, pp. 889, (2000).

T. Sato et al., "Micro Structure Transformation of Silicon: MSTS (1)—Transformation and Application Using Silicon Migration-," Extended Abstracts (The 59$^{th}$ Autumn Meeting 2000), The Japan Society of Applied Physics, 16p-YB-15, p. 757, (1998).

T. Sato et al., "Micro Structure Transformation of Silicon (3)—Transformation Control by the Annealing Pressure-," Extended Abstracts (The 46$^{th}$ Spring Meeting 1999), The Japan Society of Applied Physics and Related Societies, 28p-YF-6, p. 812, (1999).

T. Sato et al., "A New Substrate Engineering Using Silicon Surface Migration(1) -SON Structure Realized by ESS-," Extended Abstracts (The 47$^{th}$ Spring Meeting 2000), The Japan Society of Applied Physics and Related Societies, 31a-YK-6, p. 888, (2000).

T. Sato et al., "A New Substrate Engineering Using Silicon Surface Migration(2) -Design Guide for ESS Fabrication-," Extended Abstracts (The 47$^{th}$ Spring Meeting 2000), The Japan Society of Applied Physics and Related Societies, 31a-YK-7, p. 889, (2000).

T. Sato et al., "Discussion About Dissolution of COP Defects by Direct Observation by Intentionally Grown Large Vacancy," Extended Abstracts (The 60$^{th}$ Autumn Meeting 1999), The Japan Society of Applied Physics, 2p-S17, p. 355, (1999).

K. Mitsutake et al., "Micro Structure Transformation of Silicon: MSTS (2)—Theoretical Investigation-," Extended Abstracts (The 59$^{th}$ Autumn Meeting 2000), The Japan Society of Applied Physics, 16p-YB-16, p. 757, (1998).

I. Mizushima et al., "Structural Transformation Using Silicon Surface Migration," The Surface Science Society of Japan, 19$^{th}$, p. 14, (1999).

T. Sato et al., A New Substrate Engineering for the Formation of Empty Space in Silicon (ESS) Induced by Silicon Surface Migration, Apr. 2000, pp. 1-5.

Merriam-Webster's Collegiate Dictionary, 10$^{th}$ Edition 1997, definition of "PILLAR."

Notification of Reasons for Rejection issued by the Japanese Patent Office, mailed Feb. 6, 2007, in Japanese Application No. 2000-252881 and English translation of Notification.

* cited by examiner

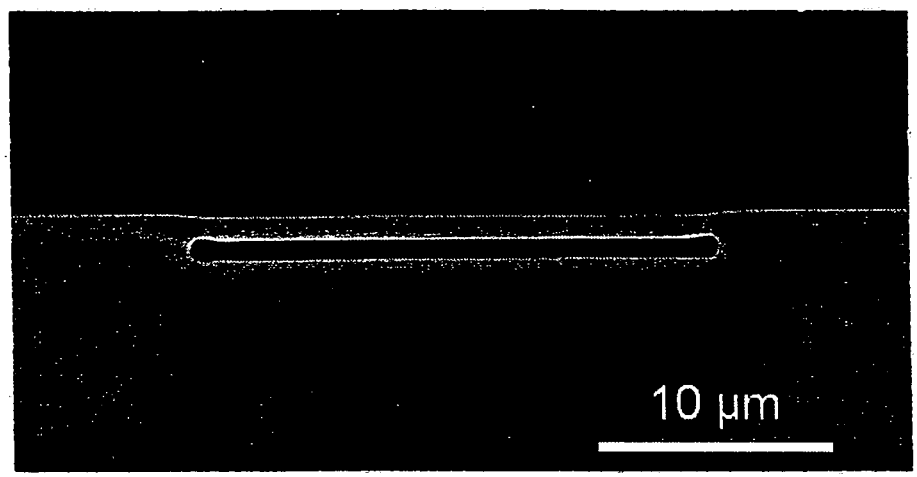
F I G. 15A
F I G. 15B
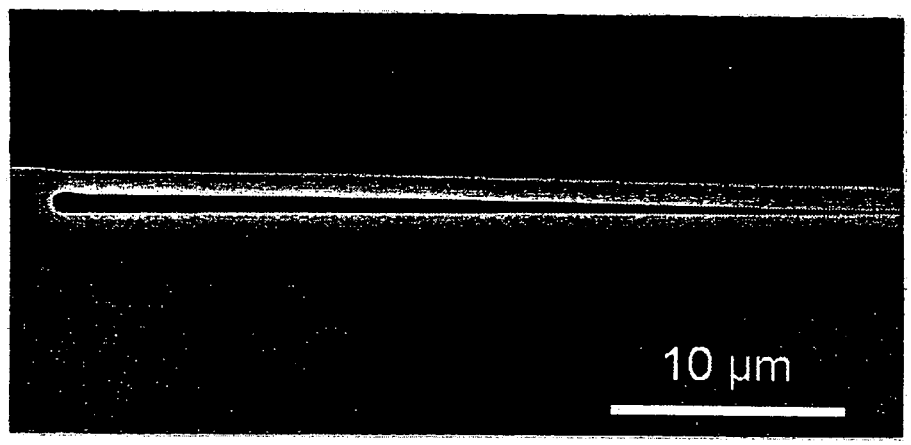
F I G. 15C

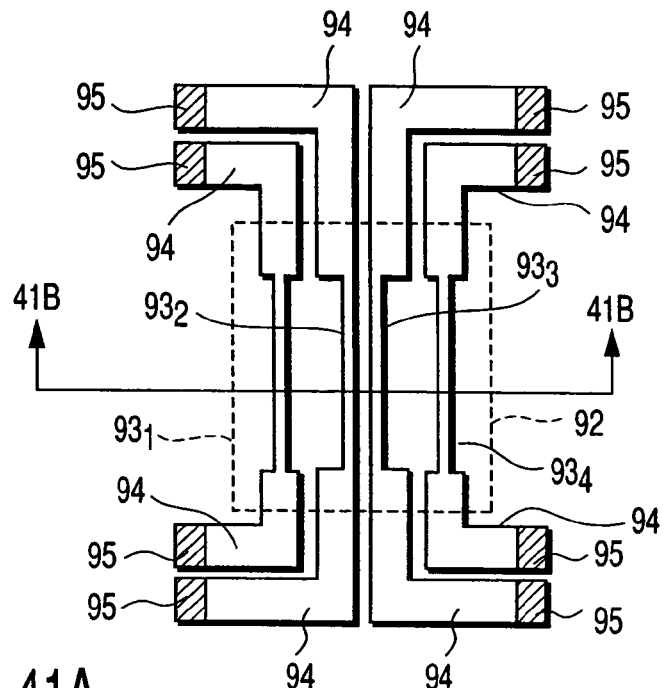
F I G. 41A
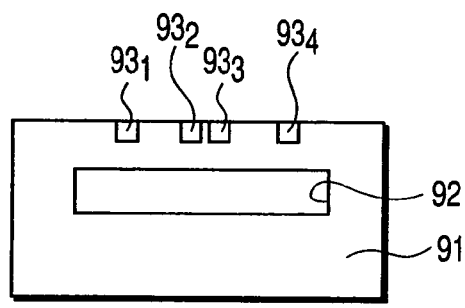
F I G. 41B
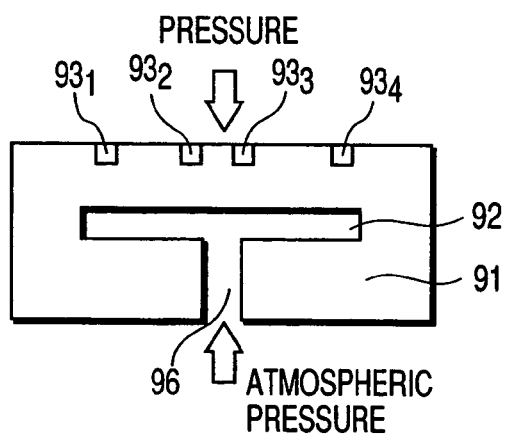
F I G. 42

METHOD OF MAKING EMPTY SPACE IN SILICON

CROSS-REFERENCE TO RELATED APPLICATIONS

This is a division of Application No. 09/650,748, filed Aug. 30, 2000 now U.S. Pat. No. 7,019,364, which is incorporated in its entirety by reference. This application is also based upon and claims priority from prior Japanese Patent Applications No. 11-246582, filed Aug. 31, 1999; and No. 2000-252881, filed Aug. 23, 2000, the entire contents of which are incorporated herein by reference.

BACKGROUND OF THE INVENTION

More operational speedup and power saving have been recently requested for electronic devices including a DRAM. As one of means for realizing operational speedup and power saving, it is listed to use SOI (Silicon On Insulator) substrate instead of a silicon substrate (bulk silicon substrate) normally used.

An SOI substrate is a substrate having a structure that a silicon region is present on an insulating region and there are several types of SOI-substrate forming methods such as the bonding method, SIMOX (Separator by IMplanted OXygen) method, and ELTRAN (Epitaxial Layer TRANsfer) method.

However, because a conventional SOI-substrate forming method requires a large cost, there is a problem that an SOI substrate is not suitable for a household electronic device such as a DRAM. Moreover, because it is difficult to form a silicon region (element-forming region) having less defects, there is also a problem that a sufficient reliability cannot be obtained compared to the case of using a bulk silicon substrate.

BRIEF SUMMARY OF THE INVENTION

It is an object of the present invention to provide a semiconductor substrate having a structure which has a similar effect to an SOI structure effect and its fabrication method without raising the cost or deteriorating the reliability.

To achieve the above object, in the case of a semiconductor substrate according to a first aspect of the present invention, flat empty space (ESS: Empty Space in Silicon) is formed in a semiconductor substrate. The empty space function as an insulator that has dielectric constant of 1. It serves to provide an SON (Silicon On Nothing) structure that is the ideal SOI structure.

In this case, it is unnecessary to form empty spaces in the entire semiconductor substrate (it is nonsense to form empty spaces in the entire semiconductor substrate because the substrate is separated at the top and bottom of an empty space). Therefore, it is enough to form empty spaces at only necessary portions. Specifically, it is enough to form empty spaces at only portions from which advantages of an SOI substrate are obtained.

Moreover, in the case of a semiconductor substrate according to a second aspect of the present invention, a flat insulating member is locally provided in the substrate.

A semiconductor-substrate fabrication method according to a third aspect of the present invention comprises the steps of forming a plurality of first trenches on the surface of a semiconductor substrate and changing the first trenches to one flat empty space by applying heat treatment to the semiconductor substrate.

Moreover, a semiconductor substrate fabrication method according to a fourth aspect of the present invention comprises the steps of forming a plurality of first trenches on the surface of a semiconductor substrate and forming a third trench with an opening face wider than that of the first trench; changing the first trenches and the third trench to one unclosed empty space having a flat spatial region and an opening face on the surface of the semiconductor substrate by applying heat treatment to the semiconductor substrate; and filling the inside of the empty space with an insulting film.

The following are preferable configurations of these semiconductor-substrate fabrication methods.

(1) The steps of forming a second trench reaching a flat empty space on the surface of a semiconductor substrate and filling insides of the second trench and the flat empty space with insulating films are further included.

(2) After a flat empty space is formed, an oxide film is formed on the inner face of a flat empty space through thermal oxidation. Thereafter, the step in (1) is executed according to necessity.

(3) A plurality of first trenches are formed so that D is smaller than 4R when assuming the minimum interval between the trenches as D and the radius of a circle having a region same as the region of the opening face of the first trench as R.

(4) A silicon substrate is used as a semiconductor substrate.

(5) Heat treatment is performed to form an empty space at a reduced pressure in an atmosphere in which $SiO_2$ is reduced in the above (4).

(6) Heat treatment is performed to form an empty space at a reduced pressure in a hydrogen atmosphere in the above (4).

(7) Heat treatment is performed to form an empty space at a reduced pressure in a temperature range between 1,000° and 1,200° C. (both included).

In the case of the semiconductor substrate having the configuration of the first or second aspect of the present invention, it is possible to form a structure having an effect similar to an SOI structure effect in accordance with the semiconductor-substrate fabrication method of the third or fourth aspect of the present invention without raising the cost or deteriorating the reliability.

Cost rise can be prevented because an insulating region of an SOI structure is formed in accordance with a simple process of changing a plurality of trenches formed on a semiconductor substrate to one empty space through heat treatment.

Moreover, in the case of this method, it is possible to form only a desired region into an SOI structure because a region on which a plurality of trenches are formed serves as an SOI structure. Therefore, by forming only a region requiring an SOI structure into an SOI structure, it is possible to further suppress cost rise and moreover, the flexibility of device design is raised.

Deterioration of reliability can be prevented because the trenches are changed to one empty space due to semiconductor surface migration caused so as to minimize the surface energy of a semiconductor substrate and thereby, the crystallinity of a semiconductor region for forming an element becomes almost the same as that of normal single-crystal semiconductor.

The surface migration achieved by the heat treatment is used, forming a single crystal region. The silicon substrate having some defects can therefore be used as initial substrate. This helps to reduce the cost of the wafer. In other words, transistors can be formed on the wafer at a lower cost than the conventional transistors formed on a bulk substrate.

The above and other purposes and novel features of the present invention will become more apparent from the description of this specification and accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 15A to 15C are microphotographs showing that a flat ESS is crushed when an ESS width increases;

FIGS. 30A to 30C are sectional views for explaining a method for fabricating the three-dimensional cyclic structure in FIG. 29;

FIGS. 31A to 31C are sectional views for explaining the three-dimensional-structure fabrication method continued from FIGS. 30A to 30C;

FIGS. 41A and 41B illustrate a pressure sensor incorporated in the sixteenth embodiment of this invention;

FIG. 42 shows a modification of the pressure sensor, for use in the sixteenth embodiment;

DETAILED DESCRIPTION OF THE INVENTION

Embodiments of the present invention are described below by referring to the accompanying drawings.

FIRST EMBODIMENT

FIGS. 1A to 1E are sectional views showing a method for fabricating a silicon substrate having a flat empty space (ESS: Empty Space in Silicon) of the first embodiment of the present invention, that is, an SON (Silicon On Nothing) substrate referred to as an ultimate SOI substrate.

Figure 1A:
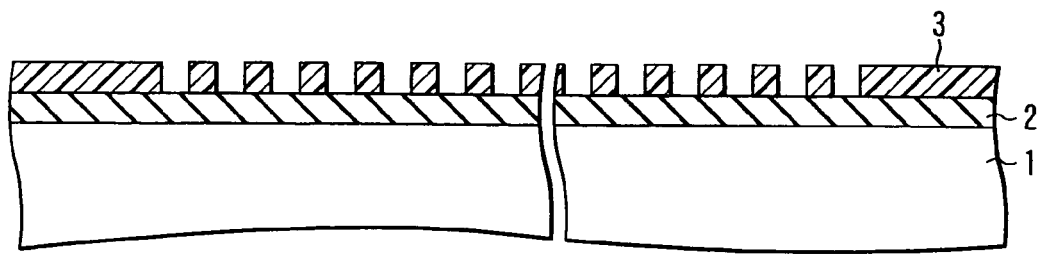
FIGS. 1A to 1E are sectional views showing a flat empty space forming method of a first embodiment of the present invention.

First, as shown in FIG. 1A, a mask material 2 is formed on a single-crystal silicon substrate 1 and a photoresist pattern 3 is formed on the mask-material 2. The mask material 2 will be described later.

Figure 1B:
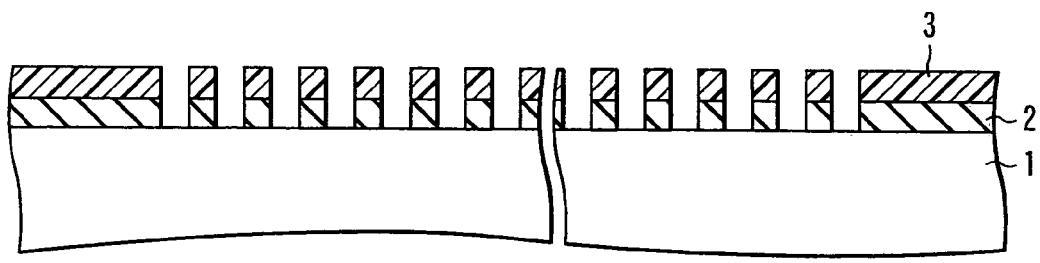

Then, as shown in FIG. 1B, the mask material 2 is patterned through anisotropic etching such as RIE by using the photoresist pattern 3 as a mask to transfer the pattern of the photoresist pattern 3 to the mask material 2.

Figure 1C:
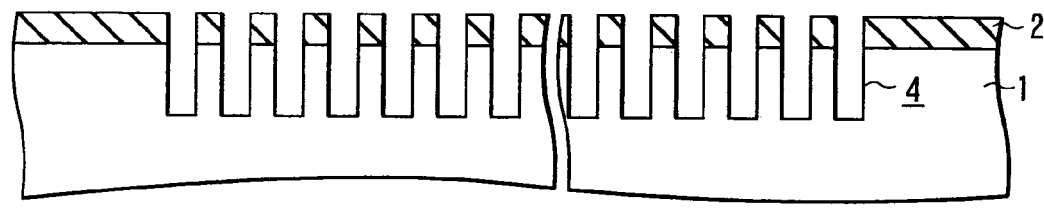

Then, as shown in FIG. 1C, the photoresist pattern 3 is carbonized and separated and then, the silicon substrate is patterned through anisotropic etching such as RIE by using the mask material 2 as a mask to two-dimensionally arrange a plurality of trenches 4 on the surface of the silicon substrate.

In this case, each of the trenches 4 has a radius of 0.2 μm and a depth of 2 μm and the minimum interval see FIGS. 3A-3C, which will be described later between the trenches 4 is 0.8 μm. A layout of the trenches 4 will be described later.

Moreover, it is preferable that the mask material 2 uses a material having an etching rate smaller enough than that of silicon when patterning the silicon substrate 1 through anisotropic etching. For example, when using RIE for anisotropic etching, a laminated film between a silicon oxide film or silicon nitride film and a silicon oxide film is suitable.

Figure 1D:
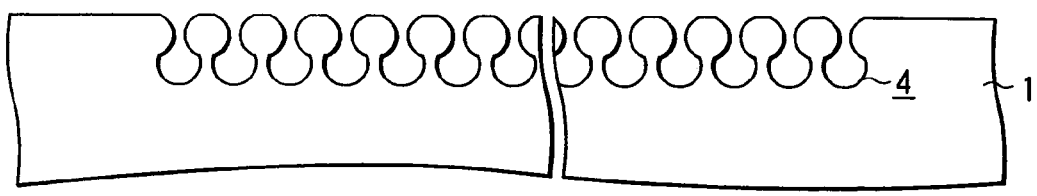
Figure 1E:
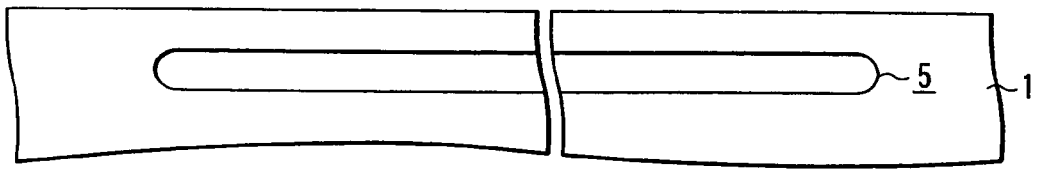

Then, by removing the mask material 2 and performing high-temperature annealing in a non-oxidizing atmosphere at a reduced pressure (pressure lower than atmospheric pressure), preferably in an atmosphere for reducing $SiO_2$ such as a 100%-hydrogen atmosphere at 1,100° C. and 10 Torr, an empty space is formed because the opening face of each trench 4 is closed as shown in FIGS. 1D and 1E and moreover, one flat empty space 5 is formed on the inner face of the silicon substrate 1 because empty spaces formed by the trenches 4 are united into one body. In this case, the heat treatment temperature is set to 1,100° C. However, it is also permitted to set the temperature to a value higher than 1,100° C.

The above shape change is caused by surface migration of silicon produced so as to minimize the surface energy after the silicon oxide film is removed from the surface of the silicon substrate 1.

Figure 2:
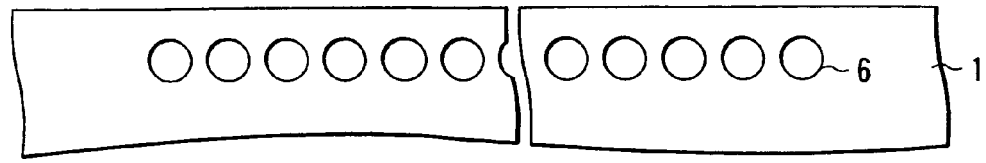
FIG. 2 is a sectional view for explaining a case in which the shape change from a plurality of trenches to one empty space does not occur.

In this case, whether a flat empty space is formed is decided by the initial layout of the trenches 4. When the minimum interval between the trenches 4 is 0.8 μm as shown for this embodiment, empty spaces formed at bottoms of the trenches 4 are united into one body as shown in FIG. 1E and thus, a large flat empty space is formed as shown in FIG. 1E. However, when the minimum interval between the trenches 4 is 0.9 μm, a spherical empty space 6 is only formed in each trench 4 as shown in FIG. 2.

A layout of the trenches 4 is more minutely described below by referring to a top view. FIGS. 3A to 3C are top views showing layouts of the trenches 4. A top view of the flat empty space 5 formed by each layout of the trenches 4 is shown at the right of each layout in FIG. 3A-3C. A W-W' sectional view of a top view of each layout of the trenches 4 corresponds to the sectional view of FIG. 1C and a W-W' sectional view of a top view of each flat empty space 5 corresponds to the sectional view of FIG. 1E.

Figure 3A:
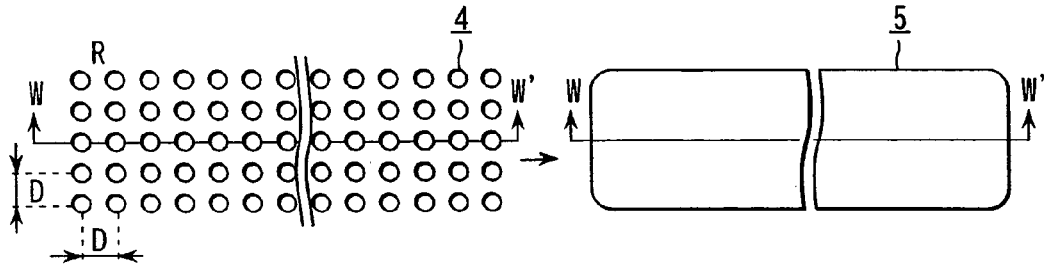
FIGS. 3A to 3C are a layout of the trenches shown in FIG. 1C and top views of flat empty spaces formed by the trenches.
Figure 3B:
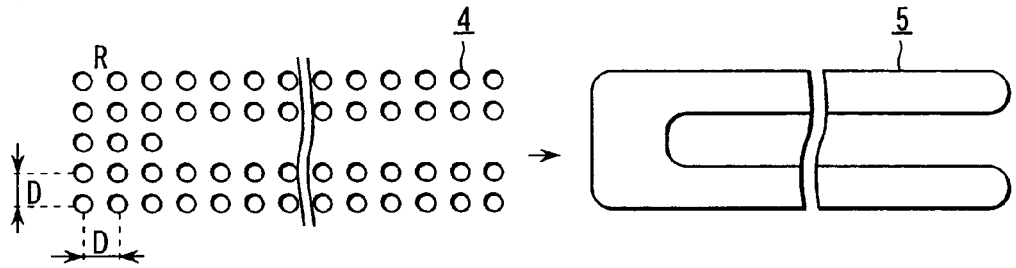
Figure 3C:
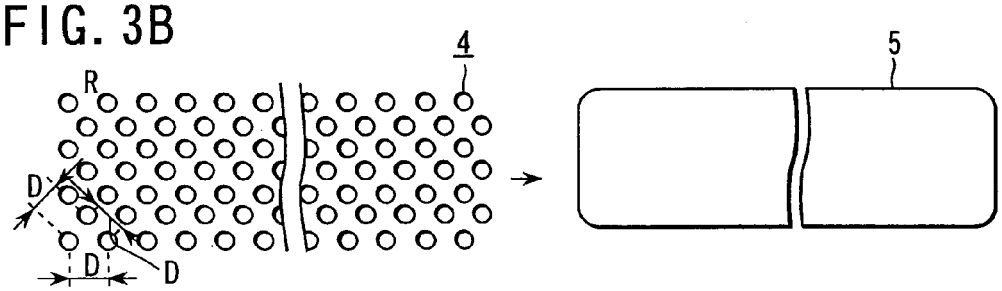

In FIGS. 3A to 3C, symbol D denotes the interval between the trenches 4 and R denotes the radius of a trench. The minor-side dimension of the empty space 5 is approx. 100 μm. The maximum major-side dimension of the empty space 5 is almost equal to the of a chip. The minimum major-side dimension of the empty space 5 is almost equal to that of a MOS transistor region of a logic portion.

According to the study by the present inventors, when $D > 4.5\,R$, it is impossible to form a flat empty space but a spherical empty space is only formed at the bottom of each trench. When $D < 4R$, it is found that a flat empty space is formed. When $4R \leq D \leq 4.5\,R$, a flat empty space can be formed or cannot be formed.

Therefore, by setting $D < 4R$ for the layout of trenches shown in FIGS. 3A-3C, empty spaces formed at bottoms of the trenches 4 are united into one body and it is possible to selectively form the flat empty space 5 in a region in which the trenches 4 are initially formed.

That is, according to this embodiment, by laying out the trenches 4 only in a region for forming the flat empty space 5 so as to meet $D < 4R$, it is possible to form the flat empty space 5 only in the region and form a silicon substrate locally having a flat empty space (dielectric region) in a wafer plane.

This represents that only a desired region in a wafer plane can be formed into an SOI structure and it is possible to obtain advantages of an SOI substrate such as high-speed characteristic and low power consumption in the region. Therefore, it is possible to obtain advantages of an SOI substrate without using the expensive SOI substrate.

Moreover, no defect is produced in a silicon region in which an element is formed, differently from the case of an SOI substrate such as SIMOX or ELTRAN. This is because an empty space is formed in accordance with surface migration of silicon caused to minimize the surface energy of a trench and thereby, the crystallinity of the silicon region in which an element is formed becomes almost equal to that of normal single-crystal silicon.

Figure 4:
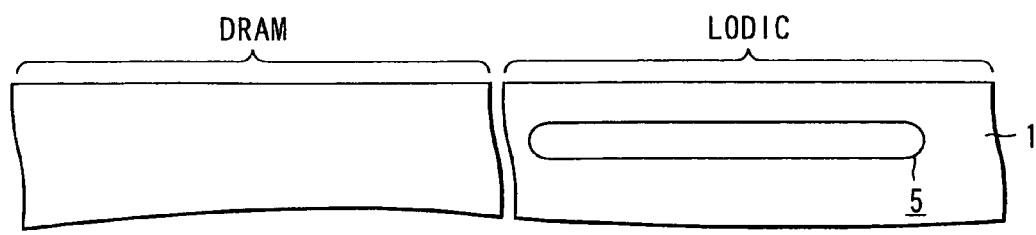
FIG. 4 is a sectional view showing a case of applying the present invention to DRAM/LOGIC mounting.

The substrate of a DRAM/LOGIC-mounted LOGIC portion for which high-speed performance and low power consumption are requested is listed as a portion on which the flat empty space is formed as shown in FIG. 4.

When forming a plurality of trenches 4 through RIE, it is preferable to form a thermal oxide film having a thickness of approx. 10 nm on the inner face of the trenches 4 immediately before performing heat treatment for shape-changing the trenches 4 to a flat empty space and then, remove the thermal oxide film. It is possible to completely remove damages of the silicon substrate 1 caused by RIE in accordance with the formation and removal of the thermal oxide film.

For this embodiment, a case is described in which the shape of the opening face of each trench 4 is circular.

However, the same result can be obtained even when the shape is rectangular. In this case, R becomes a radius of a circle having the same region as the rectangle. The same is true for shapes other than a rectangle.

Moreover, even if performing heat treatment without removing the mask material 2, it is also possible to form the flat empty space 5. However, to use the surface of the flattened silicon substrate 1, it is more preferable to perform heat treatment after removing the mask material 2 because flattening of the substrate surface can be performed at the same time. Even if performing heat treatment without removing the mask material 2, it is possible to flatten the substrate surface by adding the CMP (Chemical Mechanical Polishing) step.

The substrate surface on a flat empty space is slightly lower than other substrate surface. This may be because the volume of an empty space formed at the bottom of each trench becomes smaller than the volume of an initial trench and the substrate surface lowers by a value obtained by subtracting the volume of a flat empty space to be formed from the volume of a plurality of trenches previously formed. However, the substrate surface on the flat empty space is flat.

This represents that a step is produced at the boundary portion between a DRAM portion and a LOGIC portion when considering that the flat empty space is applied to a DRAM/LOGIC-mounted Logic portion. That is, a DRAM/LOGIC mounting to which the present invention is applied or not is clarified in accordance with whether there is a step at the boundary portion between a DRAM portion and a LOGIC portion. The same step occurs in other devices.

The above step becomes 0.1 µm or less when R is equal to 0.2 µm and D is equal to 0.8 µm. The step of this much allows exposure with no problem. The current art realizes exposure for 2 µm or less with no problem.

A specific method for reducing the influence of a step is described below. In the case of light exposure, a pattern thinner than the pattern of a mask (reticule) is transferred to resist on a step. Therefore, it is preferable to use a wide pattern at a portion corresponding to a step of a mask (reticle) by previously considering a portion to be thinned. Moreover, use of an electronic beam is listed as another method. This is because electronic-beam exposure is not easily influenced by a step compared to the case of light exposure.

As described above, there is no problem in leaving a slight step as it is. However, when the influence of the step cannot be ignored, it is preferable to flatten the entire surface by previously digging down the region other than the flat empty space forming region up to a depth to be lowered before forming the flat empty space, raising the flat empty space forming region up to a distance to be lowered after forming the flat empty space, or polishing the surface through CMP.

To previously dig down regions up to a depth to be lowered, it is necessary to selectively etch a region in which a flat empty space is not formed through RIE and retreat the surface of the region while covering the region other than the flat empty space forming region with a mask.

However, to raise the flat empty space forming region, it is permitted to perform selective epitaxial growth of Si using dichlorosilane and hydrochloric acid while covering the region other than the flat empty space forming region with a mask.

Moreover, by forming a flat empty space through high-temperature long-time heat treatment, it is possible to flatten the entire surface.

As described above, this embodiment makes it possible to realize an SOI structure in which a dielectric region is an empty space in accordance with a simple and damage-free process of changing a plurality of trenches to one flat empty space. Therefore, this embodiment makes it possible to provide a silicon substrate having the SOI structure without raising the cost or lowering the reliability in accordance with surface migration of silicon.

Moreover, because the position and size of a flat empty space can be controlled by positions and sizes of a plurality of trenches, it is possible to easily introduce an SOI structure of a desired size into a desired region in a silicon substrate.

For this embodiment, a case is described in which one flat empty space is formed in an silicon substrate. However, it is also permitted to form a plurality of flat empty spaces in a silicon substrate.

SECOND EMBODIMENT

FIGS. 5A to 5L are sectional views showing a method for fabricating a MOS transistor of the second embodiment of the present invention. In the following drawings, a symbol same as that in a previous drawing shows the same or a corresponding portion and its detailed description is omitted.

For this embodiment, a case is described in which a flat empty space is formed in a silicon substrate to fabricate a MOS transistor on the flat empty space.

Figure 5A:
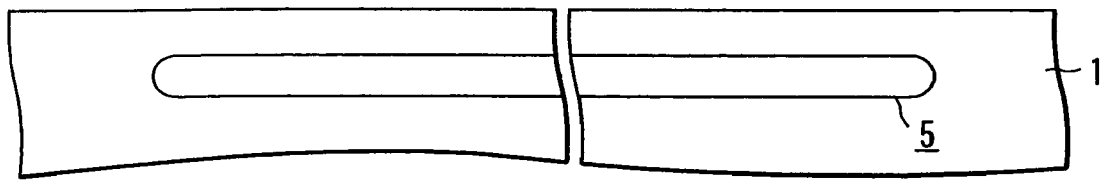
FIGS. 5A to 5L are sectional views showing a MOS-transistor fabrication method of a second embodiment of the present invention.

First, a flat empty space 5 is formed in a silicon substrate 1 as shown in FIG. 5A in accordance with the same method as the case of the first embodiment shown in FIGS. 1A to 1E.

Figure 5B:
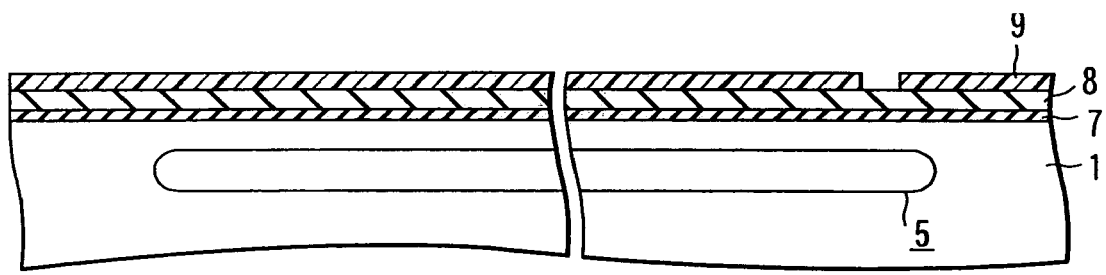

Then, as shown in FIG. 5B, a silicon oxide film 7, a silicon nitride film 8, and a photoresist pattern 9 are formed in order on the silicon substrate 1.

In this case, the photoresist pattern 9 is laid out so that at least a part of the opening of the pattern 9 is brought onto an empty space forming region. FIG. 5B shows a case in which the pattern 9 is laid out so that the entire opening is brought onto the empty space forming region.

Figure 5C:
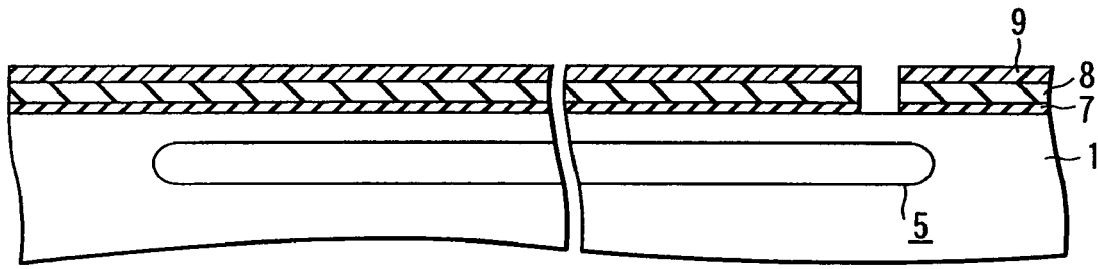

Then, as shown in FIG. 5C, the pattern of the photoresist pattern 9 is transferred to the silicon nitride film 8 and silicon oxide film 7 by using the photoresist pattern 9 as a mask and thereby patterning the silicon nitride film 8 and silicon oxide film 7 in order through anisotropic etching such as RIE.

Figure 5D:
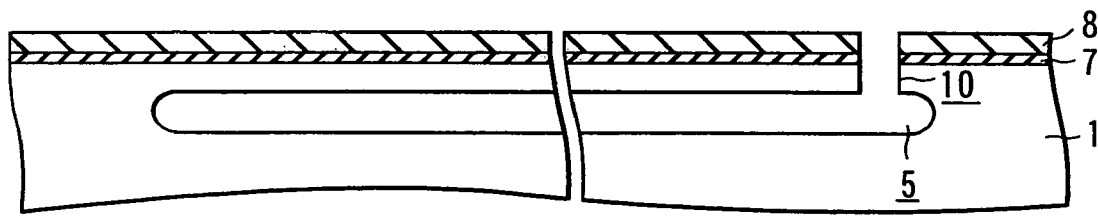

Then, as shown in FIG. 5D, a trench 10 extending up to the flat empty space 5 is formed by carbonizing and removing the photoresist pattern 9 and thereafter, using the silicon nitride film 8 and silicon oxide film 7 as masks and thereby patterning the silicon substrate 1 through anisotropic etching such as RIE.

Figure 5E:
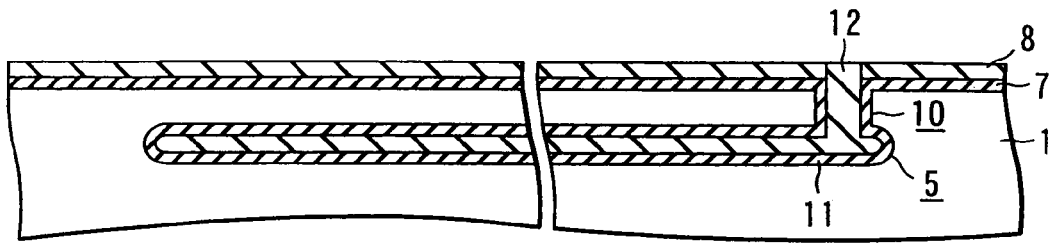

Then, as shown in FIG. 5E, a silicon thermal oxide film 11 is formed on the inner face of the flat empty space 5 through thermal oxidation. Then, as shown in FIG. 5E, a silicon oxide film 12 is deposited on the entire surface so as to fill the flat empty space 5 and trench 10 with the film 12 and then, unnecessary silicon oxide film outside of the flat empty space 5 and trench 10 is removed to flatten the surface. In this case, it is not necessary to completely fill the flat empty space 5 with the silicon oxide film 12. It is enough to only completely fill at least the trench 10 with the film 12.

Figure 5F:
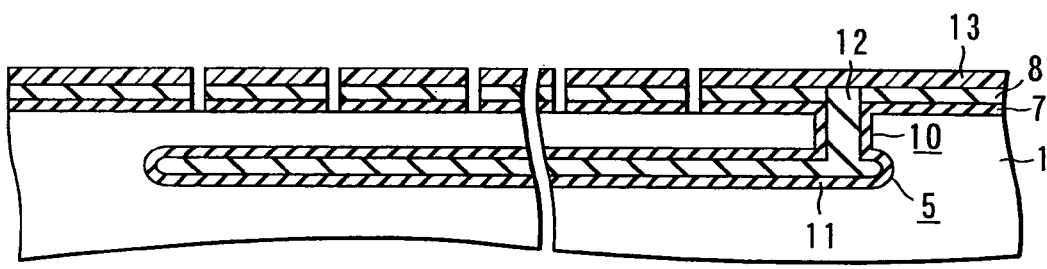

Then, as shown in FIG. 5F, a photoresist pattern 13 for forming shallow trench isolation (STI) is formed and then, the silicon nitride film 8 and silicon oxide film 7 are sequentially patterned through anisotropic etching such as RIE by using the photoresist pattern 13 as a mask to transfer the pattern of the photoresist pattern 13 to the silicon nitride film 8 and silicon oxide film 7.

Figure 5G:
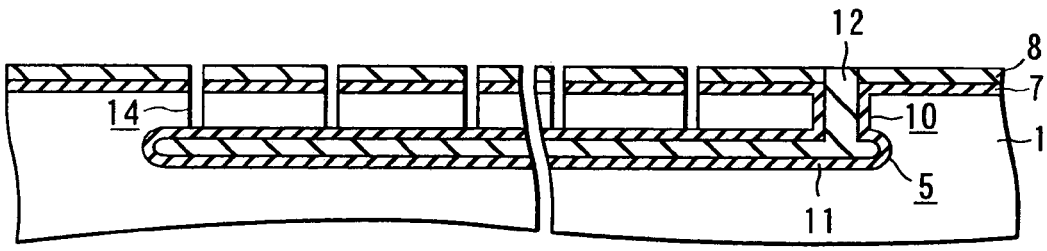

Then, as shown in FIG. 5G, the photoresist pattern 13 is carbonized and removed and then, the silicon substrate 1 is patterned through anisotropic etching such as RIE by using the silicon nitride film 8 and silicon oxide film 7 as masks to form an shallow-trench-isolation trench 14. In this case, the thermal oxide film 11 formed on the inner face of the flat empty space 4 works as a RIE stopper.

Figure 5H:
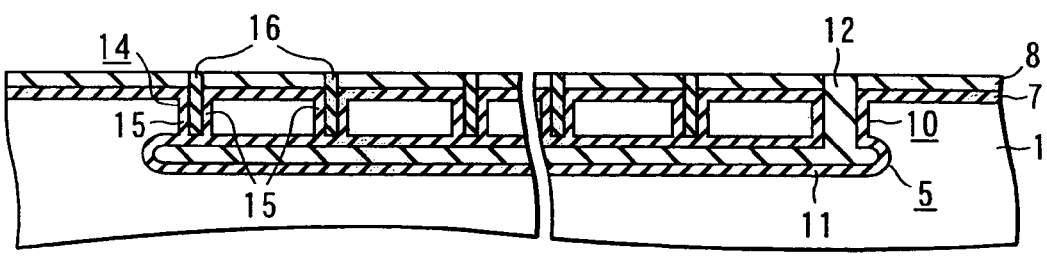

Then, as shown in FIG. 5H, a silicon thermal oxide film 15 is formed on the side face of the shallow-trench-isolation trench 14 through thermal oxidation and then, the shallow-trench-isolation trench 14 is filled with a silicon oxide film 16 to flatten the surface.

The shallow-trench-isolation trench 14 is filled by depositing the silicon oxide film 16 on the entire surface through CVD so as to fill the trench 14 with the film 16 and then, removing unnecessary silicon oxide film 16 from the outside of the shallow-trench-isolation trench 14 through CMP.

Figure 5I:
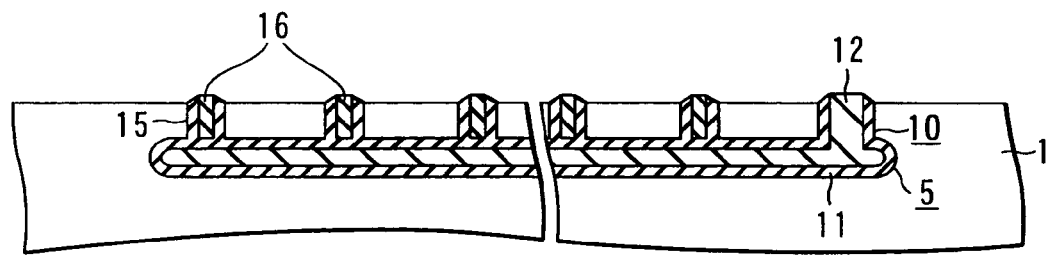

Then, as shown in FIG. 5I, the silicon nitride film 8 and silicon oxide film 7 are removed. The silicon nitride film 8 is removed by a heating $H_3PO_4$ solution and the silicon oxide film 7 is removed by a hydrofluoric-acid solution.

Figure 5J:
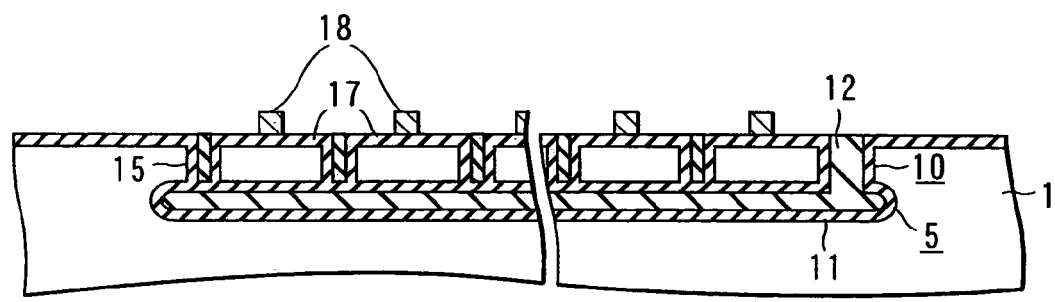

Then, as shown in FIG. 5J, the surface of the silicon substrate 1 is thermally oxidized to form a gate oxide film 17 on the surface of the substrate 1. The above thermal oxidation is performed in the atmosphere of a mixed gas of oxygen and HCl at 900° C. In this case, an oxide film is used as a gate insulating film. However, it is also permitted to use other insulating film such as a tantalum oxide film or oxynitride film.

Then, as shown in FIG. 5J, a conductive film is formed on the entire surface of the substrate and patterned to form a gate electrode 18.

The conductive film includes a polysilicon film, a laminated film of a polysilicon film and a metal silicide film, and a metallic film. Each of the above polysilicon films contains impurities and has a resistance lower than that of an undoped polysilicon film.

A polysilicon gate is formed by using a polysilicon film, a polycide gate is formed by using a laminated film of a polysilicon film and metal silicide film, and a metal-gate MOS transistor is formed by using a polycide gate and a metallic film. In the case of a metal gate, it is preferable to use the so-called damascene gate (A. Yagishita et al., IEDM 1998, p. 785).

Figure 5K:
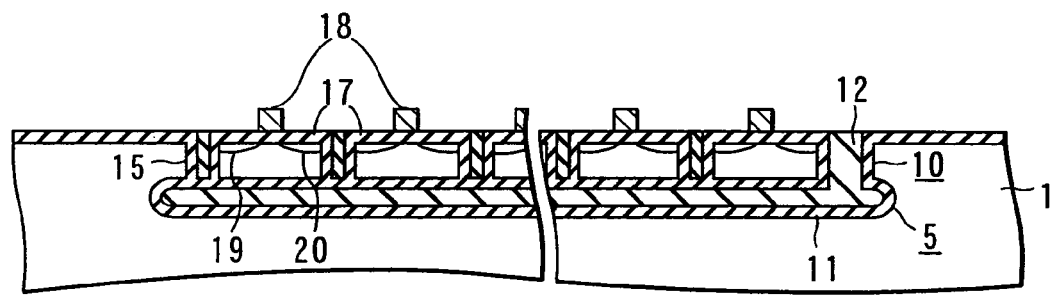

Then, as shown in FIG. 5K, a gate electrode 15 is masked and impurity ions are implanted into the silicon substrate 1 and thereafter, shallow low-concentration diffusion layers (extension) 19 and 10 are formed by performing annealing for activating the impurity ions.

Figure 5L:
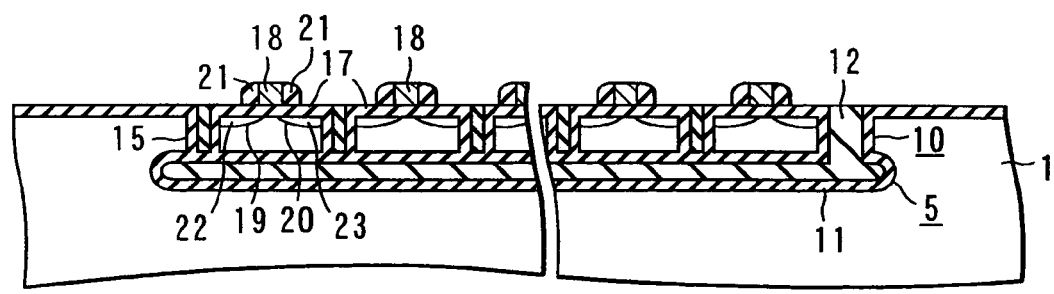

Finally, as shown in FIG. 5L, a gate-sidewall insulating film 21 is formed by the publicly-known art (sidewall leaving) and impurity ions are implanted into the silicon substrate 1 by using the gate-sidewall insulating film 21 and gate electrode 18 as masks and then, annealing for activating the impurity ions is performed to form a source diffusion layer 22 and a drain diffusion layer 23. Thus, a MOS transistor having an LDD structure is completed.

It is also permitted to omit the annealing in the step in FIG. 5K and simultaneously activate impurity ions in accordance with the annealing in the step in FIG. 5L.

In the present embodiment, a mask layer composed of the silicon nitride film 8 and silicon oxide film 7 is used to make the element-isolating trench 14. In view of its etching selectivity of the mask layer with respect to silicon, the mask layer should desirably be composed of a silicon oxide film, or a laminated structure of the silicon nitride film 8 and silicon oxide film 7'.

It is preferable to use the MOS transistor described for the above embodiment for a MOS transistor constituting a DRAM/LOGIC-mounted LOGIC. In this case, advantages of SOI such as high speed and lower power consumption can be obtained from a LOGIC region.

In this case, the fabrication process of a MOS transistor in a LOGIC region is basically the same as that of a MOS transistor in a DRAM region except that the former process uses the etching step for forming a plurality of trenches and the heat treatment step for changing a plurality of trenches to one flat empty space.

Therefore, because the conventional DRAM/LOGIC-mounting fabrication process can be almost directly used, it is possible to easily realize DRAM/LOGIC mounting from which advantages of SOI such as high-speed performance and lower power consumption can be obtained in a LOGIC region.

THIRD EMBODIMENT

FIGS. 6A to 6D are sectional views showing a method for fabricating a MOST transistor of the third embodiment of the present invention. For the second embodiment, a method for filling a flat empty space with a silicon oxide film is described. For the third embodiment, however, a method for leaving a flat empty space without filling the empty space with a silicon oxide film is described.

Figure 6A:
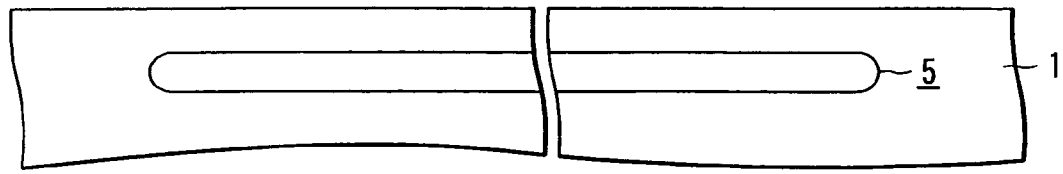
FIGS. 6A to 6D are sectional views showing a MOS-transistor fabrication method of a third embodiment of the present invention.

First, as shown in FIG. 6A, a flat empty space 5 is formed in a silicon substrate 1 in accordance with the method used for the first embodiment shown in FIGS. 1A to 1E.

Figure 6B:
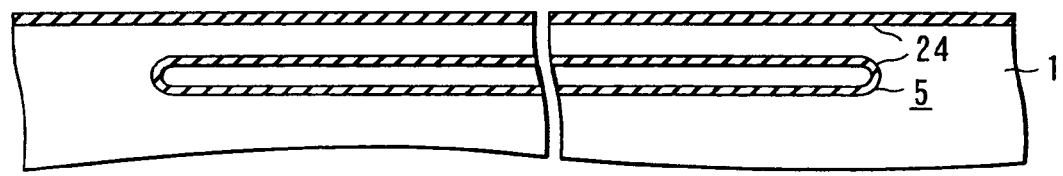

Then, as shown in FIG. 6B, a silicon thermal oxide film 24 is formed in the flat empty space 5 and on the surface of the silicon substrate through thermal oxidation. The above thermal oxidation is performed, for example, in a mixed gas of oxygen and HCl at 900° C. A silicon thermal oxide film 22 serves as a stopper under RIE as shown in FIG. 5G in subsequent steps.

Figure 6C:
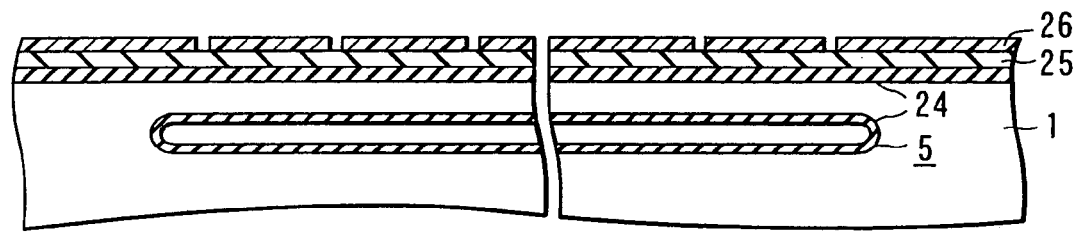

Then, as shown in FIG. 6C, a silicon nitride film 25 is formed on the silicon substrate 1 through the silicon thermal oxide film 24 and thereafter, a photoresist pattern 26 for forming shallow trench isolation (STI) is formed on the film 25.

Figure 6D:
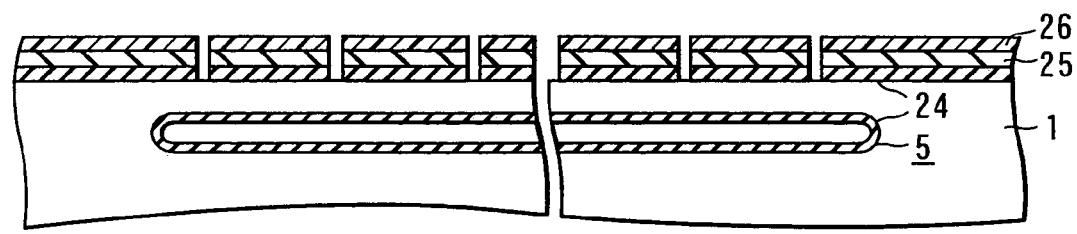

Then, as shown in FIG. 6D, the silicon nitride film 25 and the silicon thermal oxide film 24 are sequentially patterned through anisotropic etching such as RIE by using the photoresist pattern 26 as a mask to transfer the pattern of the photoresist pattern 26 to the silicon nitride film 25 and silicon thermal oxide film 24.

Figure 7:
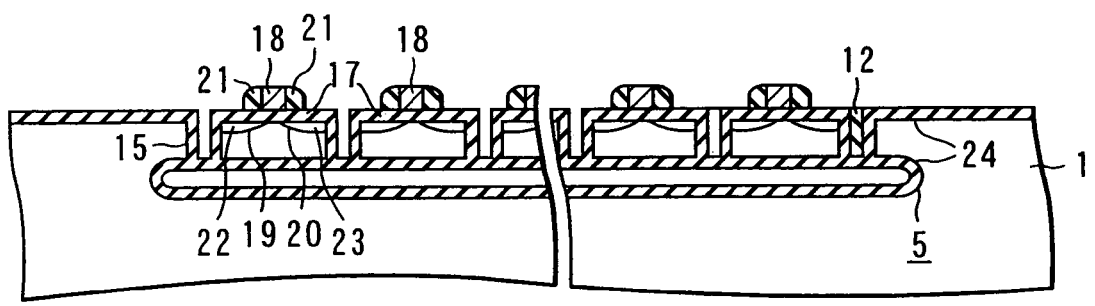
FIG. 7 is a sectional view showing a MOS transistor of the third embodiment of the present invention.

Then, the photoresist pattern 21 is removed and a MOS transistor having the LLD structure shown in FIG. 7 is completed through the steps same as those in and after FIG. 5F.

This embodiment also makes it possible to obtain the save advantages as the second embodiment. Moreover, because this embodiment does not use the step of filling the flat empty space 5 with a silicon oxide film, an advantage is also obtained that the process can be simplified.

FOURTH EMBODIMENT

FIGS. 8A to 8G are sectional views of steps showing a method for fabricating a MOS transistor of the fourth embodiment of the present invention.

Figure 8A:
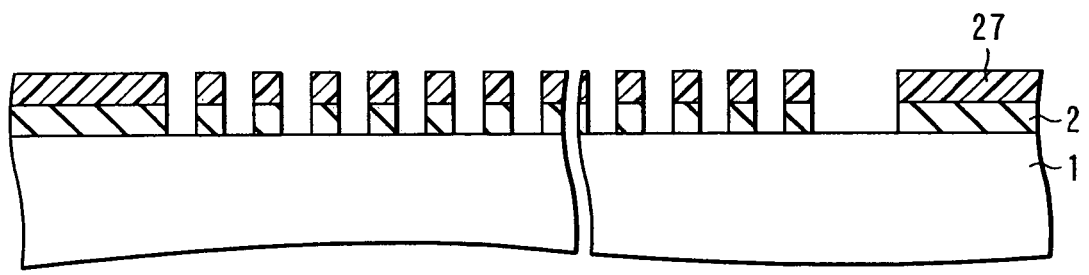
FIGS. 8A to 8G are sectional views showing the first half and the second half of a MOS-transistor fabrication method.

First, as shown in FIG. 8A, a mask material 2 and a photoresist pattern 27 are sequentially formed on a silicon substrate 1.

In this case, the photoresist pattern 27 is different from the photoresist pattern 3 of the first embodiment in FIG. 1A in that the pattern 27 has not only patterns (openings) corresponding to a plurality of trenches 4 but also patterns (openings) respectively having an area larger than each trench and corresponding to the trenches nearby the patterns.

Then, the mask material 2 is patterned through anisotropic etching such as RIE by using the photoresist pattern 27 as a mask and the pattern of the photoresist pattern 27 is transferred to the mask material 2 and thereafter the photoresist pattern 27 is carbonized to remove it.

Figure 8B:
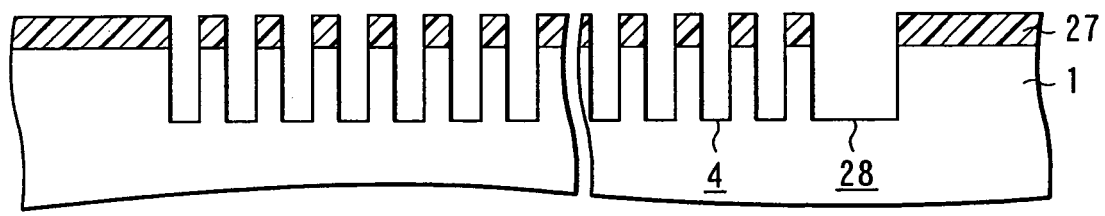

Then, as shown in FIG. 8B, a silicon substrate is patterned through anisotropic etching such as RIE by using the mask material 2 as a mask to form a plurality of trenches 4 on the surface of the silicon substrate and trenches 28 respectively having an opening area larger than each of the trenches 4 nearby the trenches 4.

Figure 8C:
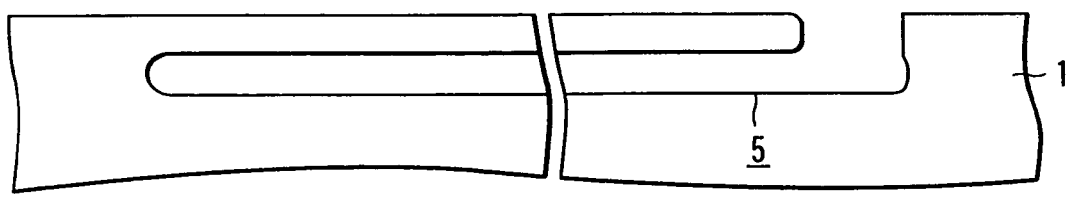

Then, as shown in FIG. 8C, the mask material 2 is removed and the trenches 4 and 28 are changed to one unclosed empty space 5 having a flat spatial region and an opening face on the substrate by performing high-temperature annealing in a pressure-reduced non-oxidizing atmosphere such as a 100% hydrogen atmosphere at 1,100° C. and 10 Torr.

In this case, shape change due to surface migration of silicon is used for the trenches 4 as shown for the first embodiment. Therefore, a spherical empty space is formed at the bottom of each trench 4 and as a result, a flat empty space is formed. However, only corners of the large trenches 28 are rounded at their bottoms.

Figure 9:
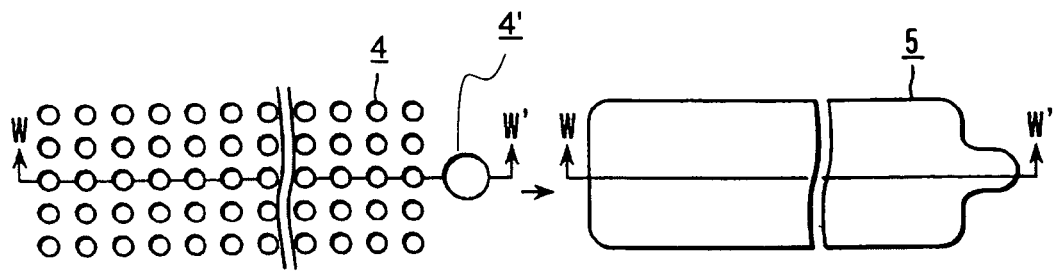
FIG. 9 is a top view showing a layout of the trenches shown in FIG. 8B and a top view of flat empty spaces formed by the trenches.

FIG. 9 shows a layout of the trenches 4 and a top view of a flat empty space. FIG. 9 corresponds to FIG. 3A, in which the left top view (trench layout) in FIG. 9 corresponds to the left top view (trench layout) in FIG. 3A and the right top view (flat empty space) in FIG. 9 corresponds to the right top view (flat empty space) in FIG. 3A.

In this case, because the large trench 28 is a trench for oxidizing the inside of the empty space 5, it is enough to use one trench 28 or more and it is enough that the trench 28 is located at a position to be connected with a flat empty space obtained due to the shape change of the trenches 4. Therefore, the position of the trench 28 is not restricted to the position shown in FIG. 9. The position is optional as long as it is close to the trenches 4. The sectional form of the large trench 28 is also optional.

Figure 8D:
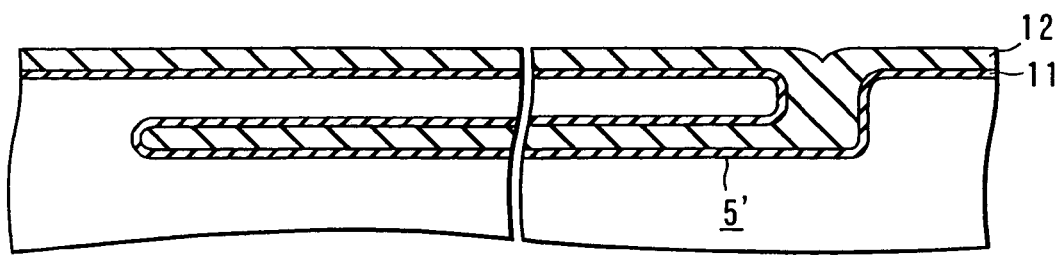

Then, as shown in FIG. 8D, a silicon thermal oxide film 11 is formed on the inner face of the empty space 5' and a silicon oxide film 12 is deposited on the entire surface so as to fill the empty space 5'.

Figure 8E:
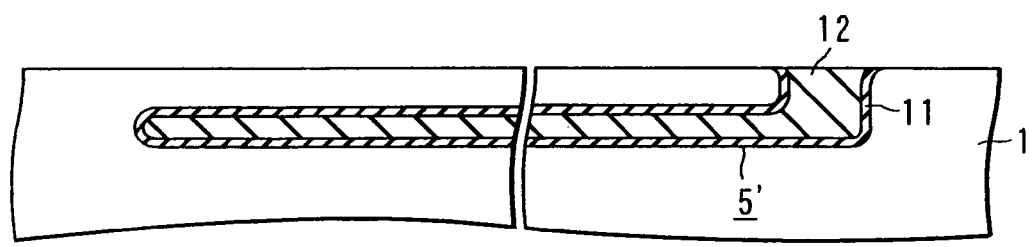

Then, as shown in FIG. 8E, the unnecessary silicon oxide film 12 outside the empty space 5' is removed through CMP to flatten the surface.

Figure 8F:
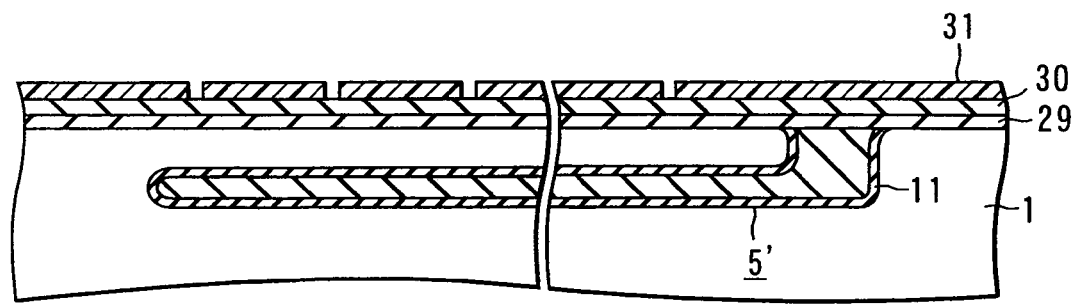

Then, as shown in FIG. 8F, a silicon oxide film 29, a silicon nitride film 30, and a photoresist pattern 31 for forming shallow trench isolation (STI) are sequentially formed on a substrate.

Figure 8G:
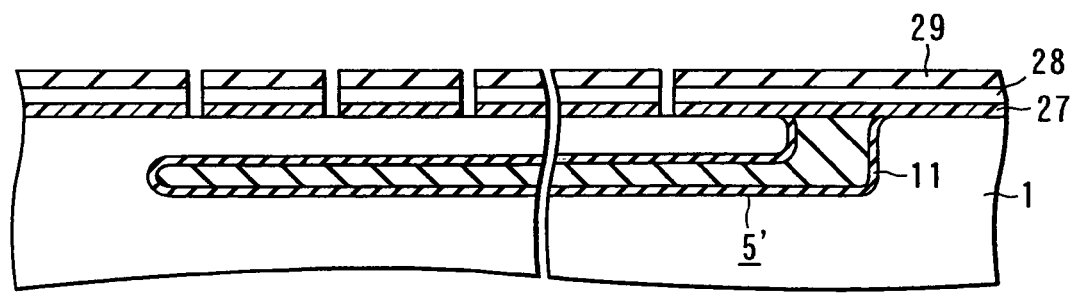

Then, as shown in FIG. 8G, the silicon nitride film 30 and silicon oxide film 29 are sequentially patterned through anisotropic etching such as RIE by using the photoresist pattern 31 as a mask to transfer the pattern of the photoresist pattern 31 to the silicon nitride film 30 and silicon oxide film 29.

Figure 10:
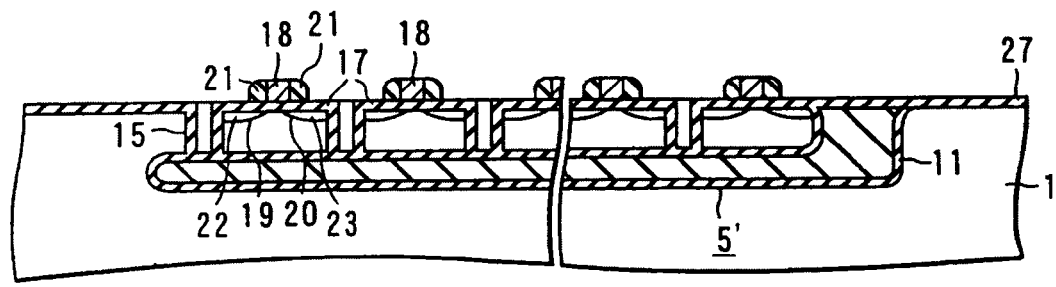
FIG. 10 is a sectional view showing a MOS transistor of a fourth embodiment of the present invention.

Then, the photoresist pattern 31 is carbonized and removed and thus, a MOS transistor having the LDD structure shown in FIG. 10 is completed through the same steps as those in and after FIG. 5F shown for the second embodiment.

FIFTH EMBODIMENT

Figure 11A:
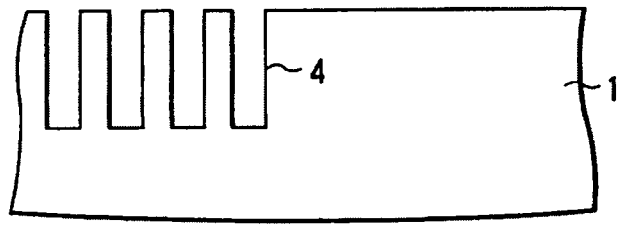
FIGS. 11A and 11B are sectional views for explaining points to be improved of the SON-substrate fabrication method described for the first to fourth embodiments.
Figure 11B:
Figure 11B:
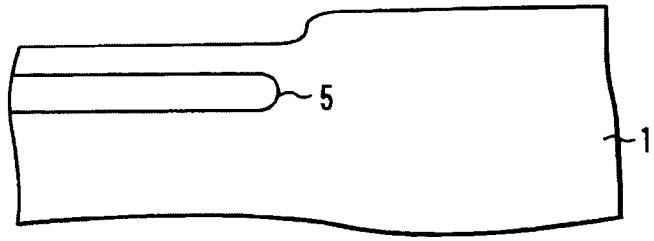

For this embodiment, an improved art be applicable to the first to fourth embodiments is described. In the case of the method for forming a silicon substrate (SON substrate) having the above-described flat empty space, a step is inevitably formed at an end of the region for forming the empty space 5 (refer to FIGS. 11A and 11B).

The above step becomes a problem when fabricating a device on a silicon substrate 1 on an empty space 5. For example, when patterning a metallic film serving as an electrode by stretching over the step, patterning cannot be made as designed. As a result, a problem occurs that a wiring is short-circuited or opened. Moreover, to perform oxidation, a stress is produced in a substrate nearby the step and a problem such as a crystal defect occurs.

To remove the step of this type, it is considered to flatten the surface in accordance with the CMP method or RIE method. The latter method is a method of removing a step by etching a region whose surface is higher through RIE while covering a region whose surface is lower with a mask film such as an oxide film. For the both methods, however, it is necessary to add one step or more to remove a step. Therefore, the number of steps is increased and resultantly the fabrication process is complicated.

Therefore, in the case of the present invention, a plurality of trenches respectively having a small aspect ratio are previously formed also in a region where the empty space 5 is not formed. The trenches formed in this case are trenches (dummy trenches) each of which has a small aspect ratio and at whose bottoms no empty space is formed and the density of the trenches is designed so that an estimated step can be removed. By previously forming the trenches thus designed, it is possible to easily remove a step at an end of the region for forming the empty space 5.

A method for forming an SON substrate using the above improved art is described below by referring to FIGS. 12A to 12E.

Figure 12A:
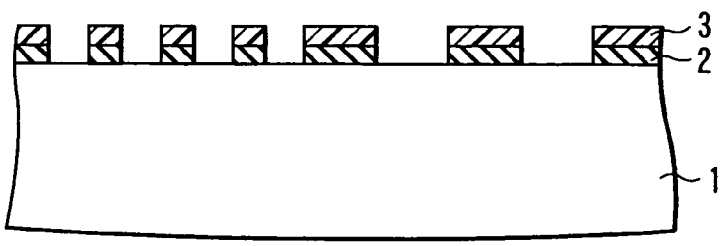
FIGS. 12A to 12E are sectional views showing an SON-substrate fabrication method of a fifth embodiment of the present invention.

First, as shown in FIG. 12A, a mask material 2 and a photoresist pattern 3 are formed on a silicon substrate 1 to etch the mask material 2 by using the photoresist pattern 3 as a mask and transfer the pattern of the photoresist pattern 3 to the mask material 2 similarly to the case of the first embodiment.

Figure 12B:
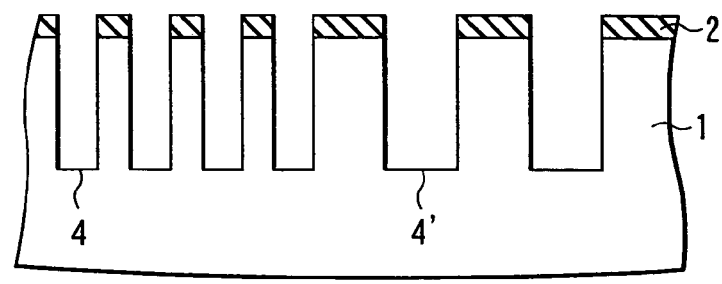

Then, as shown in FIG. 12B, the photoresist pattern 3 is removed and then, the silicon substrate 1 is patterned to form trenches 4 and 4'. In this case, the trenches 4 and 4' have aspect ratios are different from each other in aspect ratio and also different from each other in density. Aspect ratio and density will be described later.

Figure 12C:
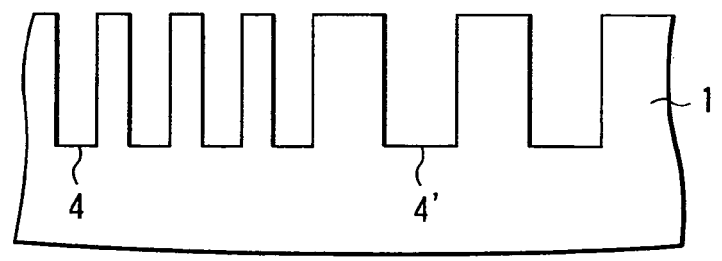

Then, as shown in FIG. 12C, a silicon oxide film 2 is removed by a hydrogen-fluoride aqueous solution.

Then, the silicon substrate 1 under the above state is heat-treated in a reductive atmosphere. Surface migration of silicon is caused by the heat treatment so that the surface energy of the silicon substrate 1 is minimized.

Figure 12D:
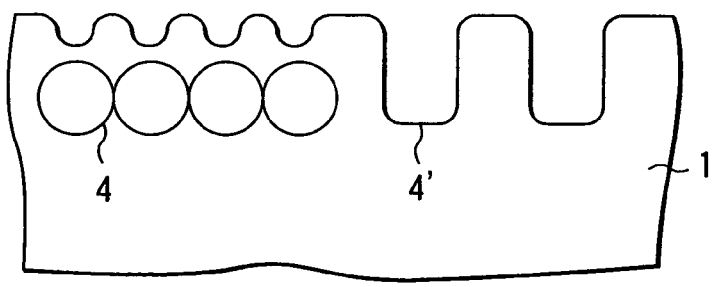
Figure 12E:
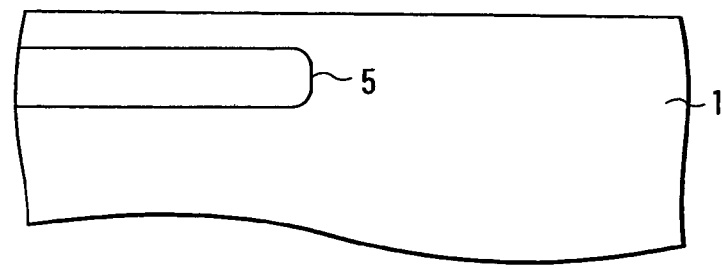

As a result, the shape of the region in which the trench 4 is formed is changed as shown in FIGS. 12D and 12E and a flat empty space 5 is formed in the silicon substrate 1. In this case, the substrate surface on the region in which the empty space is formed is lowered compared to the case of the step in FIG. 12A.

However, the shape of the region in which the trench 4' is formed is changed as shown in FIGS. 12D and 12E and the trench 4 disappears but the empty space 5 is not formed. In this case, the substrate surface on the region where the trench 4' disappears is lowered up to the substrate surface on the region where the empty space is formed. As a result, it is possible to form the empty space 4 in the silicon substrate 1 without causing the step shown in FIG. 11B.

Each step is described below in detail.

Figure 13:
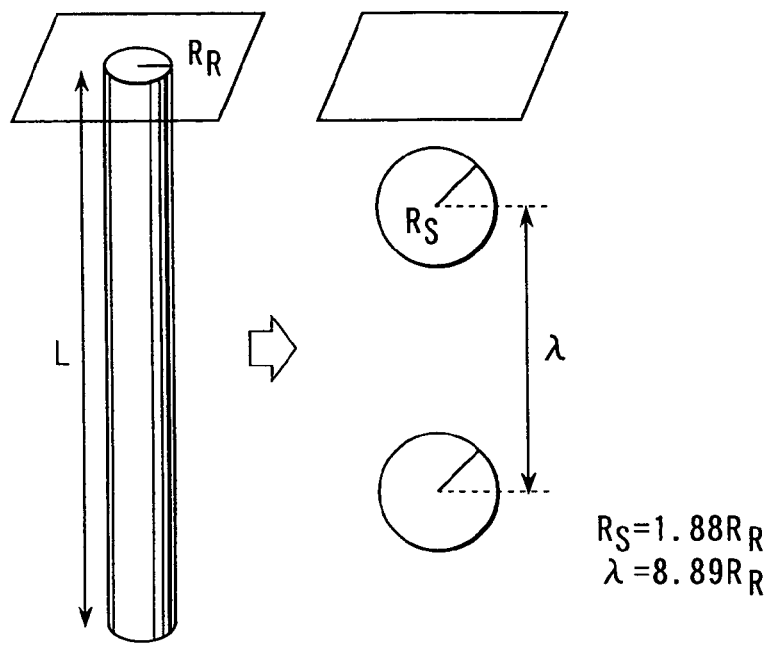
FIG. 13 is a diagram showing the relation between the shape of an initial trench and obtainable shape of an empty space from the initial trench.

First, the shape of and the number of empty spaces obtained from an initial trench shape are described below by referring to FIGS. 13 and 14. As shown in FIG. 13, when the initial trench shape is cylindrical, an obtained empty-space shape is spherical. When assuming the radius of the initial cylindrical trench as $R_R$, the radius $R_S$ of the spherical empty space becomes 1.88 $R_R$ and the interval λ between two vertically-adjacent spherical empty spaces becomes 8.89 $R_R$.

Figure 14:
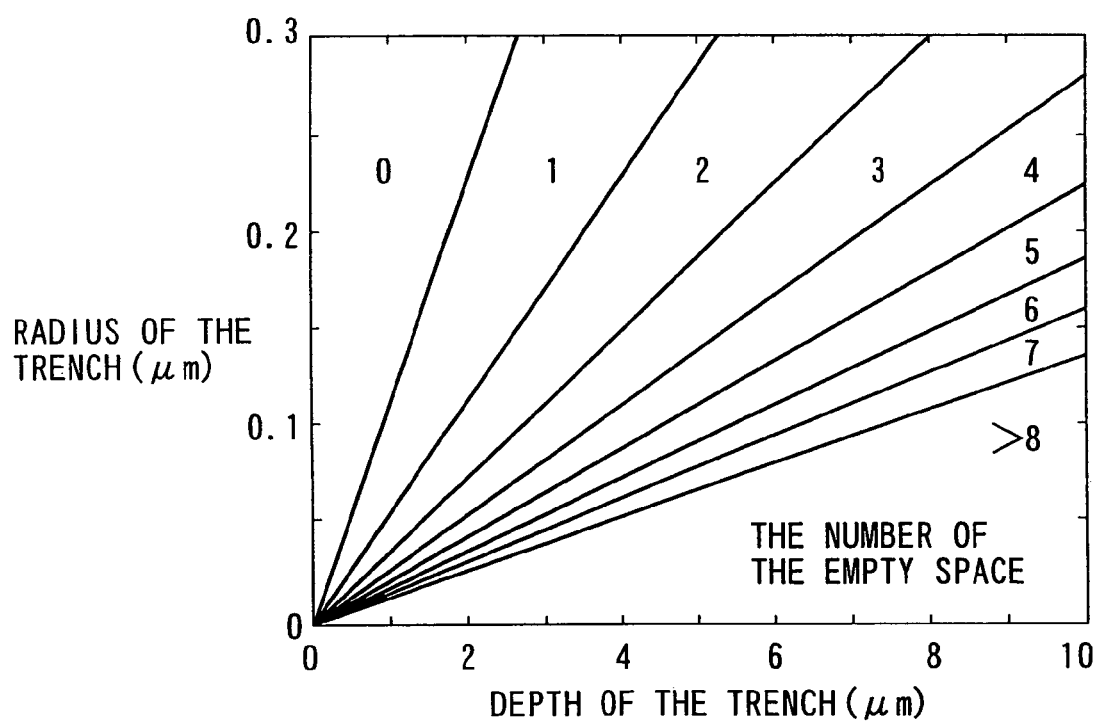
FIG. 14 is an illustration for explaining the number of empty spaces obtained for initial trench shapes.

Therefore, as shown in FIG. 14, by dividing the depth L of the initial cylindrical trench by the interval λ between empty spaces, the number of empty spaces to be obtained can be estimated. The present inventors formed a trench having a radius $R_R$=0.2 μm and examined the trench by changing the depth L to 1 and 2 μm.

As a result, in the case of a depth of 1 μm for heat treatment under the same conditions such as 1,100° C., 10 Torr, and 10 min in a hydrogen atmosphere, a trench disappeared and the substrate surface was only flattened. In the case of a depth of 2 μm, however, one spherical empty space was formed. This result coincides with the number of empty spaces estimated in accordance with the graph shown in FIG. 14 and therefore, it is confirmed that the number of empty spaces can be estimated by using FIG. 14.

Then, the aspect ratio and density of a trench to be formed are described below. The trench 4 is used to form the empty space 5 in the substrate 1. Therefore, it is necessary to set the aspect ratio of the trench 4 to 5 or more. Moreover, to form a tubular or flat empty space 5, it is necessary to previously arrange the trenches 4 like a line or grid. In this case, it is necessary to set the interval D between the trenches 4 so as to be D<4R when assuming the radius of each trench 4 as R.

The trench 4' is used to remove a step produced to form the empty space 5. Therefore, it is necessary to set the aspect ratio of the trench 4' to 3 or less so that an empty space is not formed in the silicon substrate 1. Moreover, the density of the trenches 4' is decided in accordance with the size of a step. For example, when forming the trenches 4 respectively having a radius of 0.2 μm and a depth of 2 μm so that the density of them becomes 1.6 trenches for unit area (/μm²), a step after the empty space 5 is formed is 0.12 μm. In this case, it is enough to form the trenches 4' respectively having a radius of 0.5 μm and a depth of 2 μm at a density of 0.76 trench (/μm²).

As described above, this embodiment makes it possible to easily remove a step produced at an end of an empty-space forming region in a silicon substrate without increasing the number of steps or complicating a fabrication process. A case is described above in which an empty space is flat. However, it is also permitted that the empty space has other shape. That is, the method described above is effective for an empty space in which a step is produced independently of the shape of the empty space.

SIXTH EMBODIMENT

In the case of this embodiment, another improved art is described which is applicable for the first to fourth embodiments. When forming a large-area ESS in accordance with the above method for forming a SON substrate having a flat ESS, a problem occurs that the flat ESS is crushed.

Specifically, when the ESS width shows a small value of 20 μm, a flat ESS is not crushed as shown in FIG. 15A. However, when the ESS width shows a large value of 180 μm, a flat ESS is crushed as shown in FIG. 15B and FIG. 15C which is an enlarged view of FIG. 15B. In FIGS. 15A to 15C, the heat treatment for changing trenches to an ESS is performed at 1,100° C. and 10 Torr for 10 min in a 100%-hydrogen atmosphere.

According to earnest study by the present inventors, it is clarified as described below in detail that an ESS can be prevented from crushing even if increasing the ESS width by finding an effective calculation formula for obtaining an ESS having a size not crushed and moreover improving the heat treatment for changing trenches to an ESS.

Figure 16:
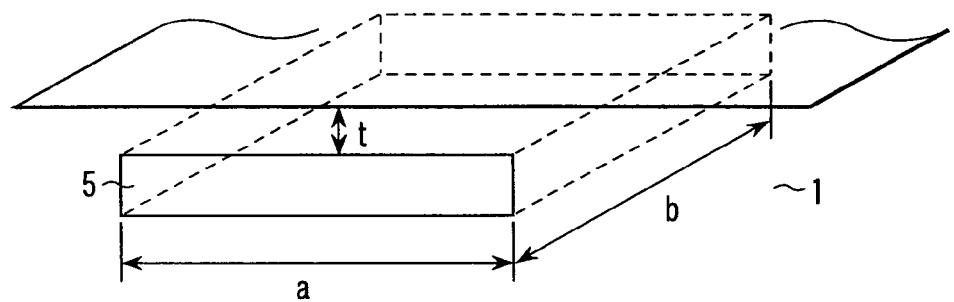
FIG. 16 is an illustration showing a model of an ESS structure used to calculate the strength of the ESS structure.

First, results of calculating the strength of an ESS structure are described below. FIG. 16 shows an ESS-structural model used for the above calculation. It is assumed that the ESS width is "a" (μm), the ESS depth is "b" (μm), and the thickness of a silicon layer on an ESS is "t" (μm). In this case, the deflection δ of the silicon layer is shown by the following expression (1).

$$\delta = \alpha P a^4 / E t^3 \quad (1)$$

In the above expression, P denotes a load applied to the silicon layer and E denotes a Young's modulus. In the case of silicon, E is equal to 0.13 (N/μm²). Moreover, α denotes a dimensionless coefficient depending on an ESS structure (=b/a). When the ESS structure is rectangular and b/a is equal to or larger than 2, α shows 0.0284. When the ESS structure is square and b/a is equal to 1, α shows 0.0138. The following calculation shows a case of b/a≧2.

First, a dead load is considered as a load applied to a silicon layer. As a result of calculating a deflection due to the dead load for an ESS structure of t=1 μm and a=180 μm, δ is as very small as 5.2×10⁻⁶ (μm) and therefore, it is found that δ can be ignored. Moreover, as a result of calculating the deflection due to the dead load by assuming α=1 mm as a larger structure, it is found that the deflection due to the dead load is small enough as δ=5×10⁻³ (μm) also in the case of a large-area ESS structure. From the above calculation results, it is found that a shape change due to a dead load is hardly influenced.

Then, a load due to the difference between the pressure in an ESS and the atmospheric pressure is considered. The pressure in the ESS is equal to or lower than the pressure for heat treatment when an ESS is formed. Therefore, when the pressure for heat treatment is equal to 10 Torr, a load almost equal to the atmospheric pressure {1.013×10⁻⁷(N/μm²)} is applied.

Therefore, the deflection due to the atmospheric-pressure load is calculated for an ESS of t=1 μm and a=180 μm the same as a dead load is. As a result, δ shows a large value of 23.2 μm and it is found that an ESS is crushed. However, when decreasing the ESS width to a=20 μm, δ becomes equal to 5×10⁻³ μm and it is found that a shape change due to a pressure load can be ignored. This well coincides with the results shown in FIGS. 18A to 18C and represents that it is possible to design an ESS having a size capable of avoiding crush in accordance with the expression (1).

Figure 17:
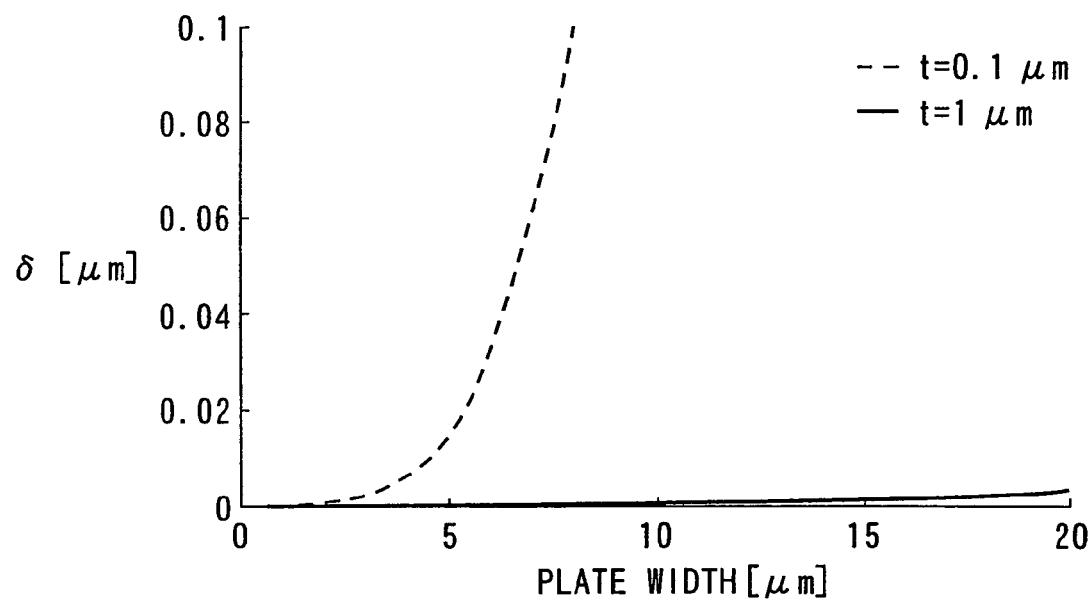
FIG. 17 is an illustration showing the relationship between plate widths deflections calculated for ESS structures different from each other in silicon-layer thickness (0.1 µm and 1 µm)

Then, an ESS having a size that can be actually realized is estimated in accordance with the expression (1). FIG. 17 shows deflections for plate widths (ESS widths) when the thickness "t" of a silicon layer is set to 0.1 μm and 1 μm.

From FIG. 17, it is found that the deflection of the silicon layer is small enough even by setting the ESS width to 20 μm when the thickness "t" of the silicon layer shows a large value of 1 μm. However, when the thickness "t" of the silicon layer shows a small value of 0.1 μm, it is found that a deflection of 0.1 μm or more occurs even if the ESS width is equal to 10 μm. Because the thickness of the ESS is almost equal to the thickness "t" of the silicon layer, it can be estimated that the ESS is crushed. That is, when the thickness "t" of the silicon layer is equal to 0.1 µm, it is found that an ESS having a size of approx. 8 µm or more cannot be realized.

Figure 18:
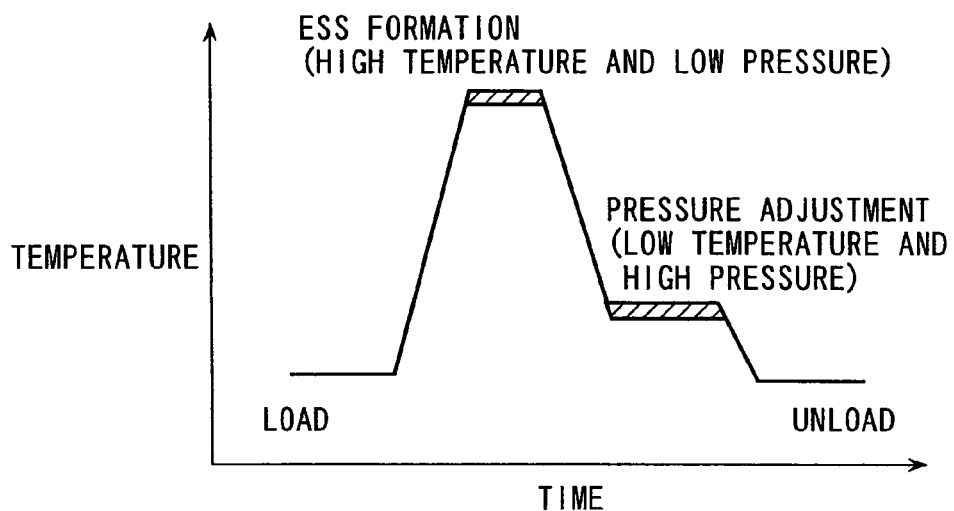
FIG. 18 is an illustration showing a heat-treatment sequence effective to form a large-region ESS.

The present inventors find that the process sequence shown in FIG. 18 is effective as a method for forming a large-area ESS. That is, first heat treatment for forming an ESS structure is executed and thereafter, second heat treatment is continuously executed without opening a chamber to adjust the pressure in the ESS.

The first heat treatment is a treatment for forming an ESS. Therefore, it is preferable to execute the first heat treatment at a high temperature and a reduced pressured at which surface migration of Si is easily generated on the surface of a silicon substrate. For example, it is preferable to execute the first heat treatment at 1,100° C. and 10 Torr for 10 min. It is permitted to use a non-oxidizing atmosphere as a heat-treatment atmosphere and for example, it is preferable to use a 100%-hydrogen atmosphere.

The second heat treatment is a treatment for adjusting the pressure in an ESS. Therefore, it is preferable to execute the second heat treatment at a low temperature and a high pressure. It is preferable to use an atmosphere containing an element having a large diffusion coefficient in silicon such as an atmosphere containing hydrogen or a 100%-hydrogen atmosphere as the heat treatment atmosphere. The diffusion coefficient D (cm$^2$/s) of hydrogen is shown by the following expression (2).

$$D=4.2\times10^{-5}exp(-0.56/kT) \qquad (2)$$

In the above expression, k denotes the Boltzmann's constant and T denotes an absolute temperature (K). According to the expression (2), the diffusion length of hydrogen at 200° C. is estimated as 1 µm for 60 sec. Therefore, hydrogen diffuses up to the inside of an ESS even for a low-temperature heat treatment of 200° C. and resultantly, it is possible to effectively change pressures in an ESS. That is, by executing the second heat treatment in a hydrogen atmosphere, it is possible to change the pressure in an ESS to a pressure equal to the pressure for heat treatment.

Moreover, when considering that pressure lowers proportionally to temperature in accordance with the ideal gas law (PV=nRT), pressure lowers while temperature lowers in the second heat treatment. Therefore, it is preferable to previously execute the second heat treatment at a certain pressure. For example, when setting the temperature for the second heat treatment to 600° C., it is enough to set the pressure for the heat treatment at 600° C. to 3 atm.

As described above, by adjusting the pressure in an ESS through the second heat treatment, it is possible to reduce or eliminate a load due to the difference between the pressure in the ESS and the atmospheric pressure. Therefore, it is possible to form a larger-area ESS structure. Moreover, even if the thickness of an SON layer is decreased to fabricate a device, it is possible to form an element on the SON layer while the ESS keeps its shape without being crushed.

SEVENTH EMBODIMENT

When fabricating a transistor on a silicon layer (SON layer) on an ESS of an SON substrate, it is necessary to set the thickness of the SON layer to 0.1 µm or less in order to completely derive advantages from the SON substrate. However, when decreasing the thickness of the large-area SON layer, the SON layer is greatly deflected due to a pressure load as described above.

Figure 19:
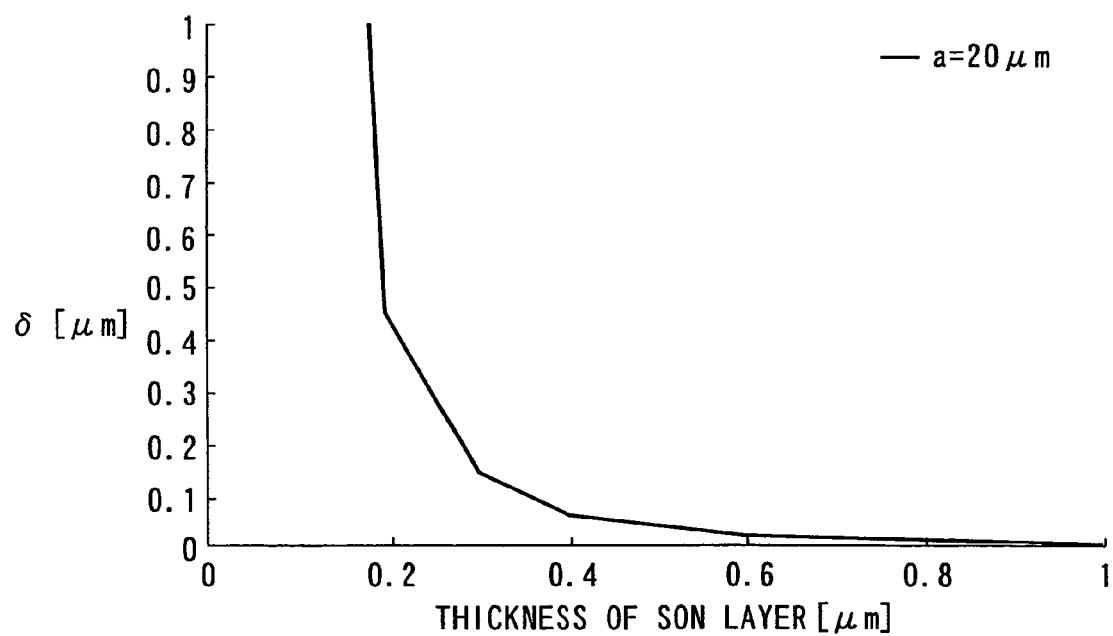
FIG. 19 is an illustration showing the relationship between SON-layer thicknesses and deflection values obtained through calculation.

FIG. 19 shows the relationship between thickness and deflection of an SON layer obtained through the calculation using the expression (1). The ESS width of the SON layer is set to 20 µm. From FIG. 19, it is found that the deflection of an SON layer formed at a thickness of 1 µm is so small that it can be ignored but the deflection of an SON layer formed at a thickness of 0.1 µm shows a large value of 1 µm or more and thus, an ESS structure is crushed.

When considering the above results, it can be said that it is effective to execute the second heat treatment before the thickness-reducing step of an SON layer under fabrication of a device after forming an ESS structure through the first heat treatment. By raising the pressure in an ESS up to approx. atmospheric pressure in the second heat treatment, it is possible to form a thin SON layer without crushing the ESS.

The technique of preventing the large, flat empty space from collapsing will be further described in conjunction with the fifteenth embodiment. If an empty space 5' is made which opens at a part as shown in FIGS. 8A to 8C, no load will be applied due to the pressure difference. In this case, an ESS made can have as large an area as desired, so long as the silicon substrate collapses by its own weight.

EIGHTH EMBODIMENT

For this embodiment, an SON substrate is described which has the same advantage as a silicon substrate (strain substrate) filled with an SiGe layer or the like immediately below a channel and capable of solving problems of the strain substrate.

First, a conventional strain substrate is described below. One of the main purposes for fining a transistor in an LSI is to realize a high-performance LSI by raising the operation speed of the transistor. However, because the gate length of a transistor has recently entered a range of 0.1 µm or less, it is increasingly difficult to downsize the transistor.

In the above background, a strain substrate constituted by embedding a different-composition layer such as an SiGe layer immediately below a channel nearby the surface of a silicon substrate is proposed as a method for realizing operation speed-up without depending on downsizing.

According to the strain substrate of this type, a strain is produced on Si nearby the surface of a substrate due to a different-composition layer and thereby, the mobility of carriers (electrons or positive holes) is improved and thus, a transistor is improved in performance.

However, embedding of a different-composition layer such as an SiGe layer causes a problem that a crystal defect occurs due to a grid strain. This problem becomes more remarkable as the Ge concentration of the SiGe layer is raised in order to increase the grid strain. That is, in the case of a conventional strain substrate, it is a big problem in a process how to form an SiGe layer containing Ge at a high concentration without causing a crystal defect.

An SON-substrate forming method of the eighth embodiment of the present invention capable of solving the above problem will be described below by referring to FIGS. 20A to 20E.

Figure 20A:
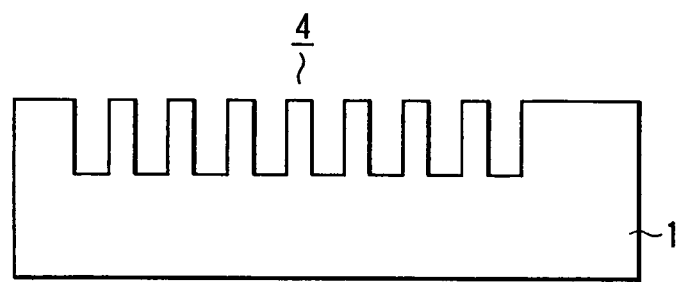
FIGS. 20A to 20E are sectional views showing an SON-substrate fabrication method of an eighth embodiment of the present invention.

First, a plurality of trenches 4 are arranged on the surface of a single-crystal silicon substrate 1 having a (100)-plane orientation as shown in FIG. 20A.

Figure 20B:
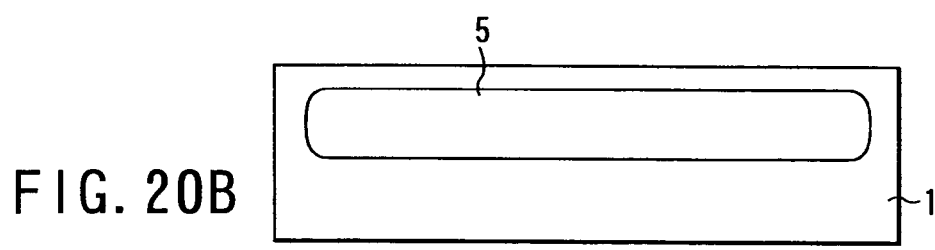

Then, as shown in FIG. 20B, the silicon on the surface of the silicon substrate 1 is circulated by heat treatment at a pressure of 10 Torr and 1,100° C. for 3 min in a mixed atmosphere of hydrogen and argon to form an empty space 5. The thickness (dimension in depth direction of substrate) of the empty space 5 thus formed through the heat treatment shows 1.2 µm and the thickness of a silicon layer (SON layer) 33 on the empty space 5 shows 0.6 µm.

Figure 20C:
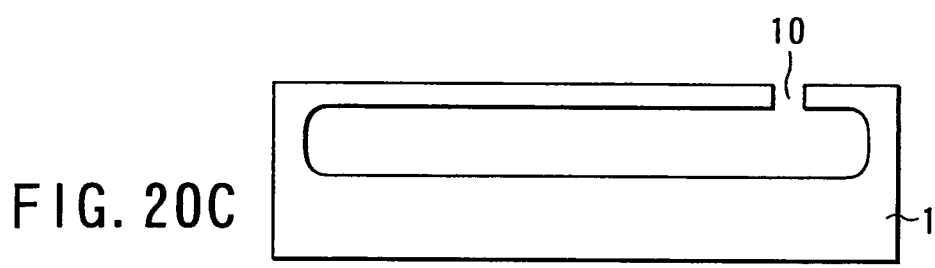

Then, as shown in FIG. 20C, a trench 10 reaching an empty space 5 is formed through publicly-known photolithography and etching. The opening face of the trench 10 is a rectangle of 3×5 µm and the depth of the trench 10 is 2.5 µm.

Figure 20D:
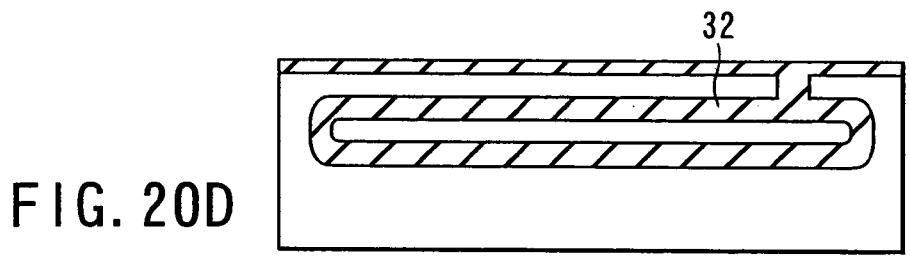

Then, as shown in FIG. 20D, the surface of the silicon substrate 1 is thermally oxidized to form a silicon oxide film 32 having a thickness of 0.4 µm. As a result of performing the above oxidation, the thickness of the SON layer 33 decreases from 0.6 to 0.4 µm.

Figure 20E:
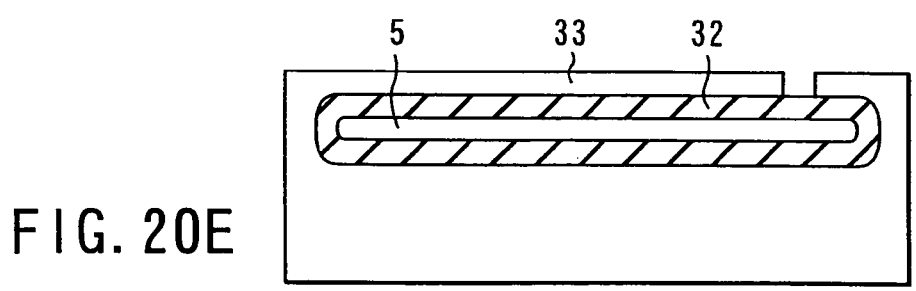

Finally, as shown in FIG. 20E, an SON substrate is completed by selectively removing the silicon oxide film 32 from the surface of the silicon substrate 1 through RIE and selectively leaving the silicon oxide film 32 in the empty space 5 and the trench 10.

As a result of measuring the internal stress in the SON layer 33 of the SON substrate thus obtained by the Raman spectroscopy, it is confirmed that a tensile stress of 250 MPa is present.

The above tensile stress is generated because the silicon substrate 1 has a thermal expansion coefficient larger than that of the silicon oxide film 32. When the silicon substrate 1 is oxidized at a high temperature, a strain is moderated. However, when the high temperature of the silicon substrate 1 is lower to room temperature, a strain is not moderated. As a result, a tensile stress is generated in the silicon substrate 1 having a thermal expansion coefficient relatively larger than that of the silicon oxide film 32.

As a result of measuring an internal stress in the SON layer of an SON substrate on which the silicon oxide film 32 made for comparison is not formed, a significant stress is not found. This shows that the structure obtained through the thermal oxidation step for forming the silicon oxide film 32 and the subsequent etching step for selectively leaving the silicon oxide film in the empty space 5 and trench 10 is useful to intentionally form a stress field in the SON layer 33.

Moreover, because a different-composition layer such as an SiGe layer is not embedded in the SON substrate of this embodiment, a problem of a crystal defect due to a grid strain does not theoretically occur.

Furthermore, it is found that the SON substrate of this embodiment has an advantageous structure compared to that of a conventional oxide-film-embedded substrate (SOI substrate). Even in the case of a conventional SOI substrate, an oxide film is present under an SOI layer. Therefore, the same advantage as the SON substrate of this embodiment can be theoretically expected.

In the case of the conventional SOI substrate, however, it is impossible to generate a large stress in an SOI layer by an oxide film because the oxide film is too thin compared to the case of the SOI layer and the oxide film has a thickness of 1 µm or less and the SOI layer has a thickness of 1 mm.

In the case of the SON substrate of this embodiment, however, because the SON layer 33 corresponding to the SOI layer of a conventional SOI substrate has a thickness of 0.6 µm, that is, the SON layer 33 and the silicon oxide film 32 have almost the same thickness, it is possible to generate a large stress in the SON layer 33.

Figure 21:
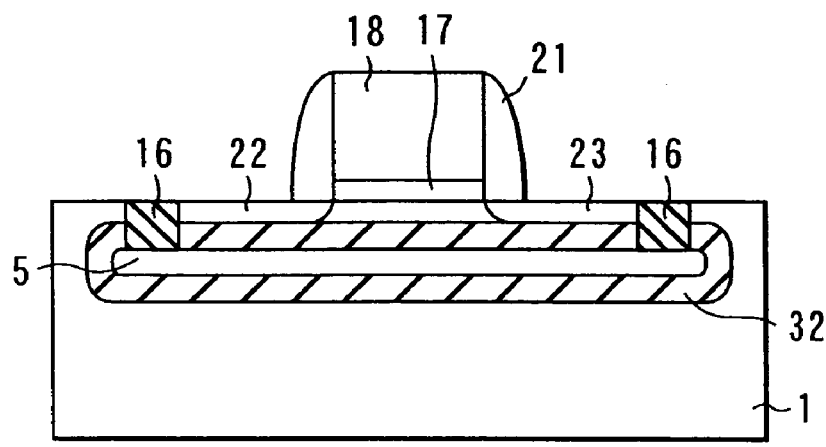
FIG. 21 is a sectional view of a MOS transistor fabricated by using an SON substrate.

FIG. 21 shows a sectional view of a MOS transistor fabricated by using the SON substrate of this embodiment. As a result of measuring the mobility of the MOS transistor, it is found that the mobility is improved by 35% compared to the case of a MOS transistor fabricated on a conventional normal bulk substrate. Moreover, it is found that the mobility is improved compared to the case of a MOS transistor formed on an SOI substrate or a MOS transistor fabricated on an SON substrate in which the inside of an empty space is not oxidized.

The mobility of the MOS transistor fabricated on the SON substrate of this embodiment is higher than that of the MOS transistor fabricated on the conventional SOI substrate probably because of the synergistic effect between the fact that the empty space 5 is present in the substrate and thereby, a parasitic capacitance can be reduced compared to the case of the conventional SOI substrate and the fact that a state in which a high stress is present in an SON layer can be realized by the silicon oxide film 32.

Figure 22A:
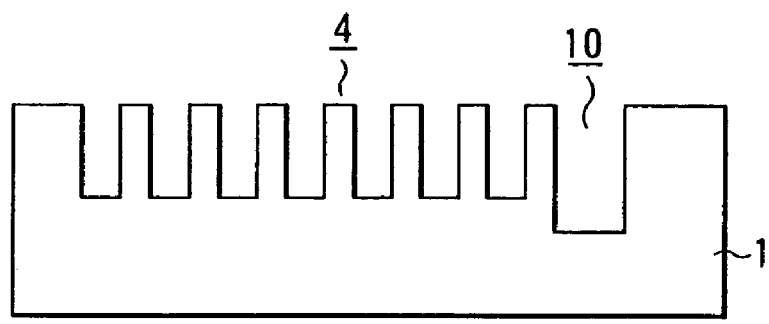
FIGS. 22A and 22B are sectional views for explaining a modification of the SON-substrate fabrication method of the eighth embodiment.
Figure 22B:
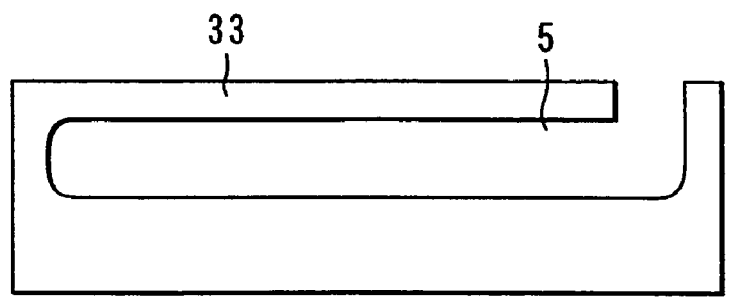

In the case of this embodiment, the trench 10 is formed after the empty space 5 is formed in order to oxidize the inside of the empty space 5. However, it is also possible to form the trench 10 by the method shown in FIGS. 22A and 22B. In the case of this method, a plurality of trenches 4 and one deep trench 10 having an opening diameter larger than that of each trench 4 are simultaneously formed. Then, the heat treatment for changing the trenches 4 to one empty space is performed. However, because the upper portion of the large trench 10 is not closed as shown in FIG. 22B, an empty space having an opening structure shown in FIG. 20C is formed. Subsequent steps are the same as those shown in and after FIG. 20D. The layout of the trenches 4 and 10 is not restricted to that shown in FIG. 22A. Various layouts can be used.

Moreover, in the case of this embodiment, the silicon oxide film 32 is formed on the entire surface including the substrate surface and then, selectively removed from the substrate surface in order to selectively form the silicon oxide film 32 only on the insides of the empty space 5 and trench 10. However, it is also permitted to perform the following. That is, it is also permitted to selectively form an oxidation preventive film such as a silicon nitride film on the surface of a substrate and then, oxidize only the inside of an empty space through oxidation.

Furthermore, in the case of this embodiment, the silicon oxide film 32 is formed on the inner face of the empty space 5 in order to generate a tensile stress in an SON layer. However, it is also permitted to use other film. That is, it is possible to use a film as long as the film is formed of a material having a thermal expansion coefficient different from that of single-crystal silicon (different-material film). Furthermore, even a different-material film formed of a material having a thermal expansion coefficient not greatly different from that of single-crystal silicon can be used as long as the film makes it possible to produce a strain on a semiconductor film. As long as the above conditions are satisfied, it is permitted to use an insulating film or a metallic film as a film (stress generation film) to be formed in the empty space 5.

Furthermore, for this embodiment, a case is described in which the SON layer 33 and silicon oxide film 32 have almost the same thickness. To increase a strain generated in the SON layer 33 by the silicon oxide film 32, it is preferable that the ratio of the thickness of the SON layer 33 to that of the silicon oxide film 32 increases. However, if the ratio is too large, a problem occurs in substrate strength.

From various tests by the present inventors, it is clarified that it is preferable to keep the ratio between semiconductor-layer thickness on one hand and semiconductor-layer thickness plus different-material-film thickness on the other in a range of 0.1 to 0.9.

Moreover, though the silicon oxide film 32 is formed on the entire inner wall of an empty space in the case of this embodiment, it is also permitted to form a stress generation film such as the silicon oxide film 32 on a part of an empty space as long as a tensile stress can be produced in the SON layer 33.

NINTH EMBODIMENT

In the case of this embodiment, an SON substrate is described which has the same advantages as a silicon substrate (strain substrate) in which an SiGe layer or the like is embedded immediately below a channel and makes it possible to solve problems of the strain substrate.

FIGS. 23A to 23D are sectional views showing a method for forming an SON substrate of the ninth embodiment of the present invention.

Figure 23A:
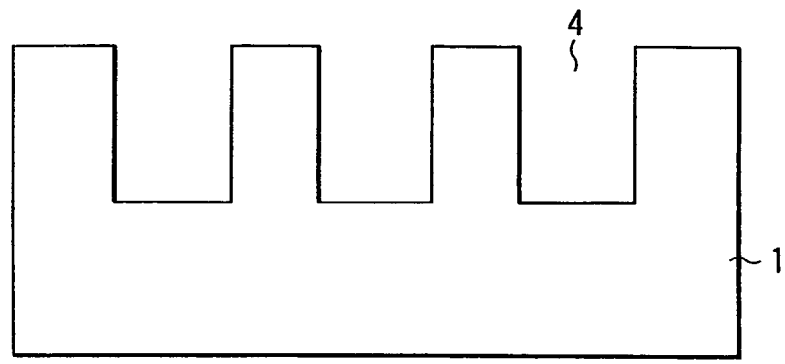
FIGS. 23A to 23D are sectional views showing an SON-substrate fabrication method of a ninth embodiment of the present invention.

First, as shown in FIG. 23A, a plurality of trenches 4 are formed on the surface of a silicon substrate 1 through publicly-known lithography and RIE.

Figure 23B:
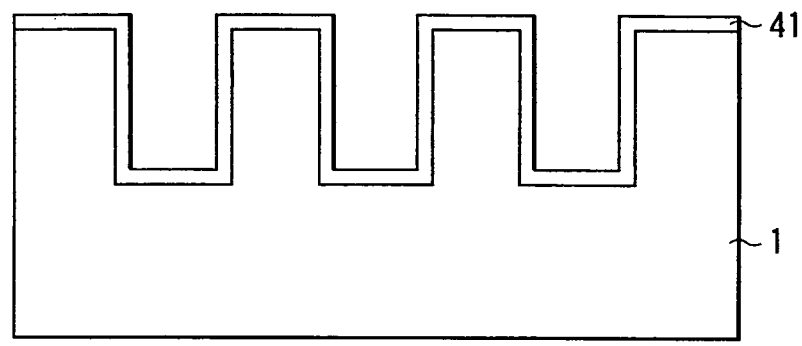

Then, as shown in FIG. 23B, an SiGe layer 41 containing 30% of Ge in a number-of-atoms density ratio and having a thickness of 100 nm is epitaxially grown on the entire surface so as to cover insides of the trenches 4.

Figure 23C:
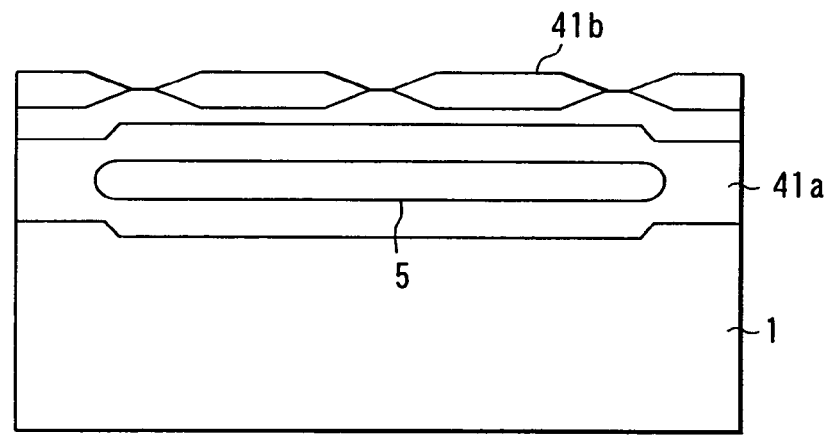

Then, as shown in FIG. 23C, an empty space 5 in which an SiGe layer (embedded SiGe layer) 41a is present is formed at the upper portion, lower portion, and side portion of the silicon substrate 1 by circulating the surface of the silicon substrate 1 through the heat treatment at 1,050° C. for 5 min in a vacuum state at a pressure of $10^{-7}$ Pa. In this case, an SiGe layer (remaining SiGe layer) 41b is also formed on the surface of the silicon substrate 1.

Then, a silicon oxide film (not illustrated) is formed on the substrate surface through thermal oxidation to increase the Ge concentration in the embedded SiGe layer 41a and then, the silicon oxide film and the remaining SiGe layer 41b are removed. Thereby, it is possible to raise the Ge composition ratio of the embedded SiGe layer 41a.

Figure 23D:
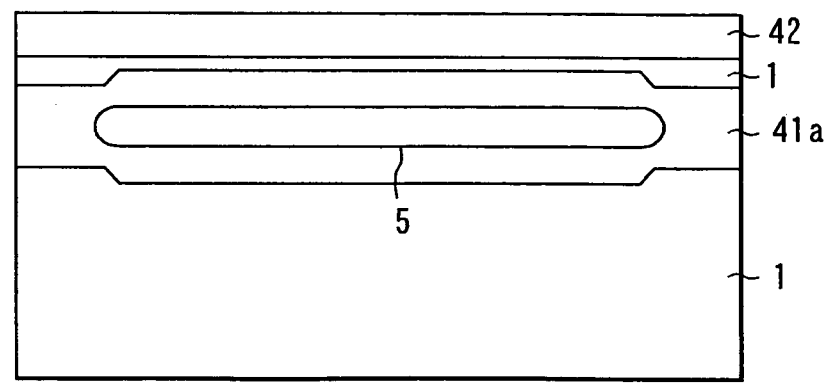

Finally, as shown in FIG. 23D, a silicon layer 42 containing no Ge is epitaxially grown on the surface of the silicon substrate 1 to complete an SON substrate.

As a result of measuring the stress of the silicon substrate 1 on the empty space 5 of the SON substrate thus obtained and the stress of the silicon layer 42 on the substrate 1, the stresses show 80 MPa. From the above result, it is found that forming the embedded SiGe layer 41a in a substrate is effective to intentionally generate a stress in an SON layer.

In the case of this embodiment, the trenches 4 are formed and then, the SiGe layer 41 is epitaxially grown. However, it is also permitted to form the trenches 4 after epitaxially growing the SiGe layer 41 on the entire surface of a substrate. In this case, the trenches 4 are formed and then, the substrate surface is circulated through heat treatment to form the empty space 5 and the embedded SiGe layer 41a.

Moreover, forming a silicon oxide film through thermal oxidation after circulating the substrate surface is effective to raise the Ge composition ratio of the embedded SiGe layer 41a. However, it is not always necessary to form the silicon oxide film.

Also, forming the Si layer 42 by epitaxial growth after circulating the substrate surface is effective to form a SON layer which does not contain Ge. However, it is unnecessary to form the Si layer 42 when the layer 42 is not required for device application.

Figure 24:
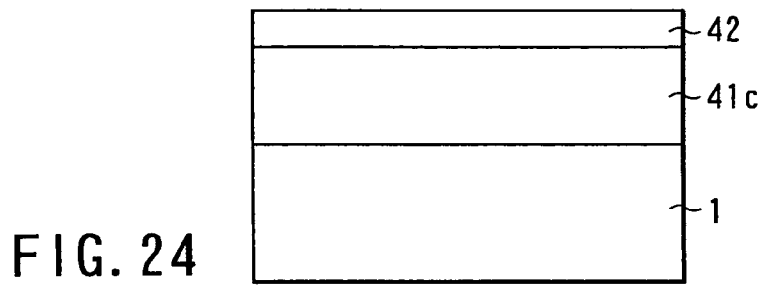
FIG. 24 is a sectional view showing a conventional substrate having an SiGe layer.

The SON substrate of this embodiment has the following advantages compared to a substrate having the conventional SiGe layer 41c shown in FIG. 24.

The prior art uses a method of continuously changing Ge compositions of an SiGe layer 41c from a low-concentration state up to a high-concentration state in the film-thickness direction by using the silicon substrate 41 as a seed. Therefore, the thickness of the SiGe layer 41c reaches approx. hundreds nm. That is, it is necessary to form the SiGe layer 42 thick.

Figure 25:
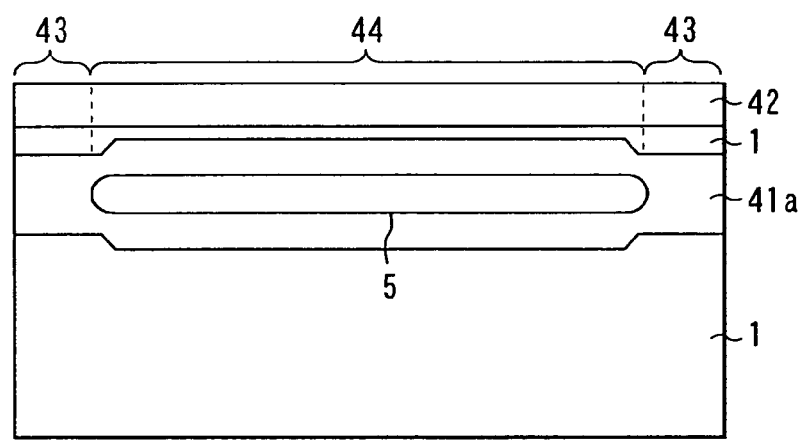
FIG. 25 is a sectional view showing the SON substrate of the ninth embodiment of the present invention.

In the case of this embodiment, however, no defect is produced in the SiGe layer 41a on the empty space 5 because the SiGe layer 41a corresponding to the conventional SiGe layer 41c is formed through surface migration of Si and SiGe (FIG. 23C). Therefore, it is not necessary to form the SiGe layer 41a thick and it is possible to decrease the thickness of the layer 41 up to tens of nm. FIG. 25 shows the above state. Many defects are produced in a silicon substrate 1 and silicon layer 42 in a region 43 in which an empty space 5 is not formed below and the defect density rises. However, no defect is substantially produced at all in the silicon substrate 1 and silicon layer 42 in a region 44 serving as a region for fabricating an element in which the empty space 5 is formed below and thus, the defect density completely lowers.

This embodiment uses SiGe as a material of a different-material film (SiGe layer 41a). However, it is also possible to sues other material different from a substrate material (Si).

Moreover, similarly to the case of the eighth embodiment, for the relationship between the thickness of a semiconductor layer such as the Si layer 42 and the thickness of a different-material film such as the SiGe layer 41, it is confirmed that advantages of the present invention are realized when the ratio between the semiconductor-layer thickness on one hand and the semiconductor-layer thickness plus different-material-film thickness on the other ranges between 0.1 and 0.9. Furthermore, it is permitted to use the SiGe layer 41 for a part of an empty space as long as it is possible to generate a tensile stress in an SON layer.

TENTH EMBODIMENT

For this embodiment, a case of applying the ESS art of the present invention to formation of photonic crystal is described.

By cyclically forming materials having refractive indexes different from each other, it is possible to form photonic crystal. The photonic crystal is noticed as a new optical material for realizing a fine optical integrated circuit. The reason is to be added later.

Moreover, because the photonic crystal can be formed on silicon, it is expected that a future optoelectronic integrated circuit is realized which makes it possible to avoid past mounting problems and is fused with a CMOS process.

Though many photonic-crystal forming methods have been proposed so far, it has been particularly difficult to form three-dimensional photonic crystal. Moreover, combination of materials having a large difference between refractive indexes of them is preferable. Though a combination of silicon and air is ideal, it is very difficult to realize the combination of them.

Figure 26:
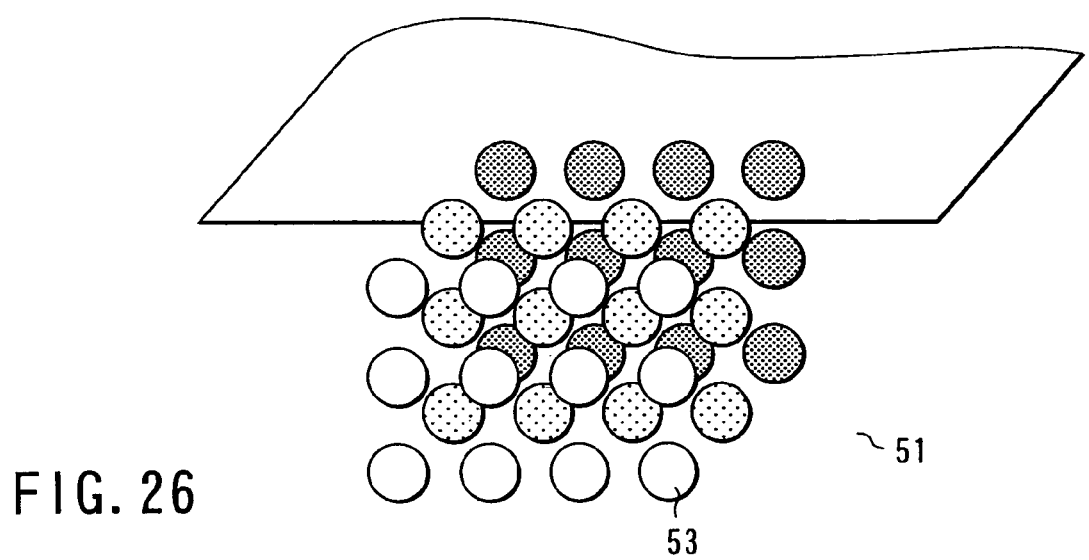
FIG. 26 is a schematic view of a three-dimensional cyclic structure of a tenth embodiment of the present invention.

FIG. 26 shows a schematic view of a three-dimensional cyclic structure (photonic crystal) of the tenth embodiment of the present invention. In FIG. 26, symbol 51 denotes a silicon substrate in which same-size spherical empty spaces 52 (shown so that color density gradually increases in depth direction) are cyclically three-dimensionally arranged.

A three-dimensional cyclic structure fabrication method of this embodiment is described below by referring to FIGS. 27A to 27C and FIGS. 28A to 28C.

Figure 27A:
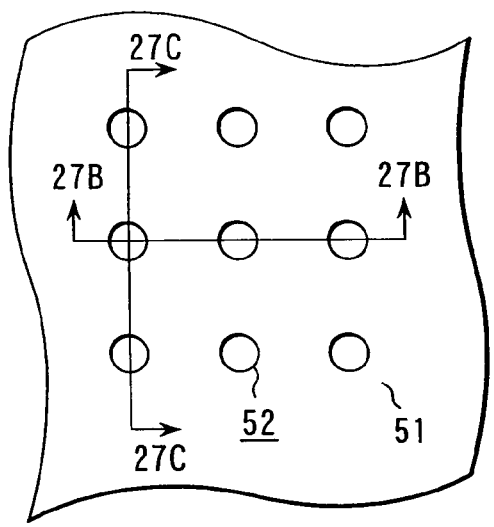
FIGS. 27A to 27C are sectional views for explaining a method for fabricating the three-dimensional cyclic structure in FIG. 26.
Figure 27B:
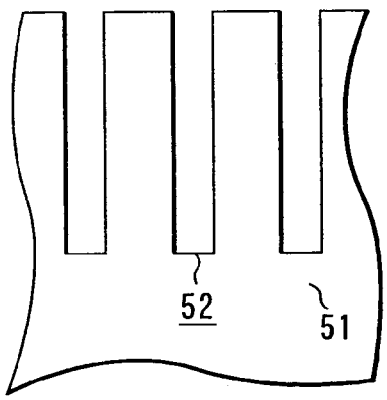
Figure 27C:
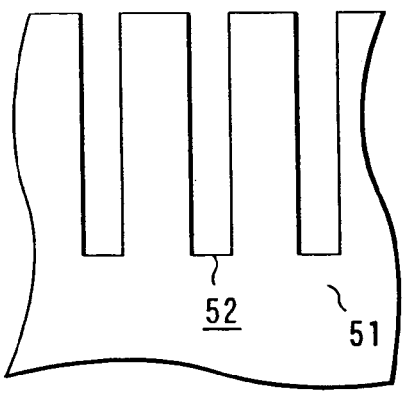

First, as shown in FIGS. 27A to 27C, a mask pattern (not illustrated) comprising an oxide film is formed on the silicon substrate 51, the silicon substrate 51 is etched through reactive ion etching by using the mask pattern as a mask to two-dimensionally form trenches 52 having the same depth and same opening diameter and then, the mask pattern is removed.

Figure 28A:
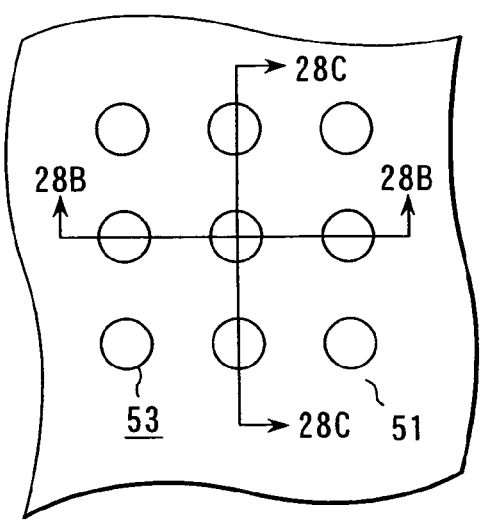
FIGS. 28A to 28C are sectional views for explaining the three-dimensional cyclic structure fabrication method continued from FIGS. 27A to 27C.
Figure 28B:
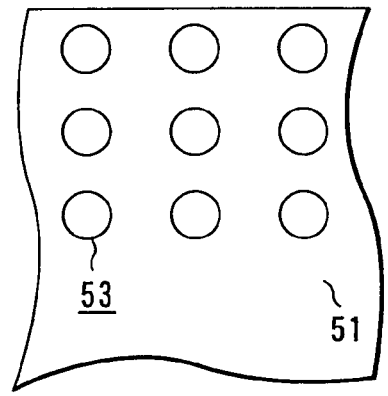
Figure 28C:
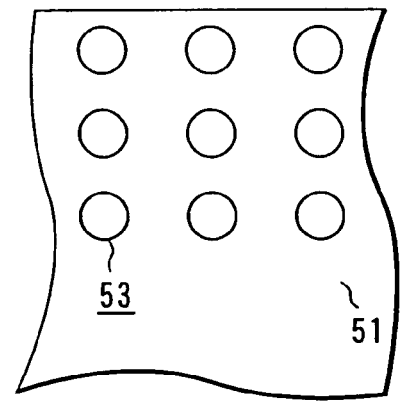

Then, as shown in FIGS. 28A to 28C, high-temperature reduced-pressure heat treatment is applied to the silicon substrate 51 on which the trenches 52 are formed in an non-oxidizing atmosphere to form an empty space pattern on which a plurality of spherical empty spaces (ESSs) 53 having the same size are formed is formed in the silicon substrate 51. Specifically, an empty space pattern is formed in which empty spaces are arranged on the same line at equal intervals in the depth direction of the substrate and arranged like a grid in the same plane of the substrate.

The heat treatment for forming the empty spaces 53 is performed to cause surface migration of silicon. Therefore, it is preferable to completely remove natural oxide films from the substrate surface. To completely remove the natural oxide films, it is effective to keep the heat-treatment atmosphere in a non-oxidizing state. To easily realize the above mentioned, it is preferable to use a 100%-hydrogen atmosphere as the heat-treatment atmosphere. Moreover, to accelerate the surface migration of silicon, it is preferable to perform the heat treatment at a pressure of 10 Torr or lower. Typical heat treatment is performed in a 100%-hydrogen atmosphere at a temperature of 1,100° C. and a pressure of 10 Torr for 10 min.

A case of performing heat treatment after removing a mask pattern is described above. However, it is also permitted to perform heat treatment without removing a mask pattern. In this case, however, it is necessary to remove a mask pattern after heat treatment and flatten the surface of a substrate by performing heat treatment again.

Because the three-dimensional cyclic structure of this embodiment is constituted by cyclically arranging materials (silicon and empty space or air) having refractive indexes different from each other, it becomes photonic crystal having a forbidden band to light. The wavelength dependency which is one of the characteristics of photonic crystal is scaled by all factors (cycle and wavelength of empty space 5). Therefore, by changing the cycle of the empty space 5 to a cycle corresponding to a wavelength used, it is possible to form photonic crystal to be operated at a desired wavelength.

To specifically control the cycle of the empty space 5, diameters and depths of the trenches 52 are changed for a depth-directional cycle. For a cycle in the direction vertical to the depth direction, cycles of the arrangement of the trenches 52 are changed.

As described above, according to this embodiment, it is possible to easily realize a three-dimensional cyclic structure constituted by combining materials (silicon:3.6/air:1) having a large refractive-index difference, by using the surface migration of silicon. The three-dimensional cyclic structure operates as photonic crystal capable of controlling light. Therefore, it is possible to operate the three-dimensional cyclic structure of this embodiment as an optical element such as an optical waveguide, polarizer, or prism.

Moreover, according to the above method, it is possible to decrease the cycle of the empty space 5 to 1 μm or less. That is, it is possible to form a fine optical element in a silicon substrate. Thereby, it is possible to easily fabricate an optoelectronic circuit constituted by fusing an optical element with a CMOS process.

ELEVENTH EMBODIMENT

Figure 29:
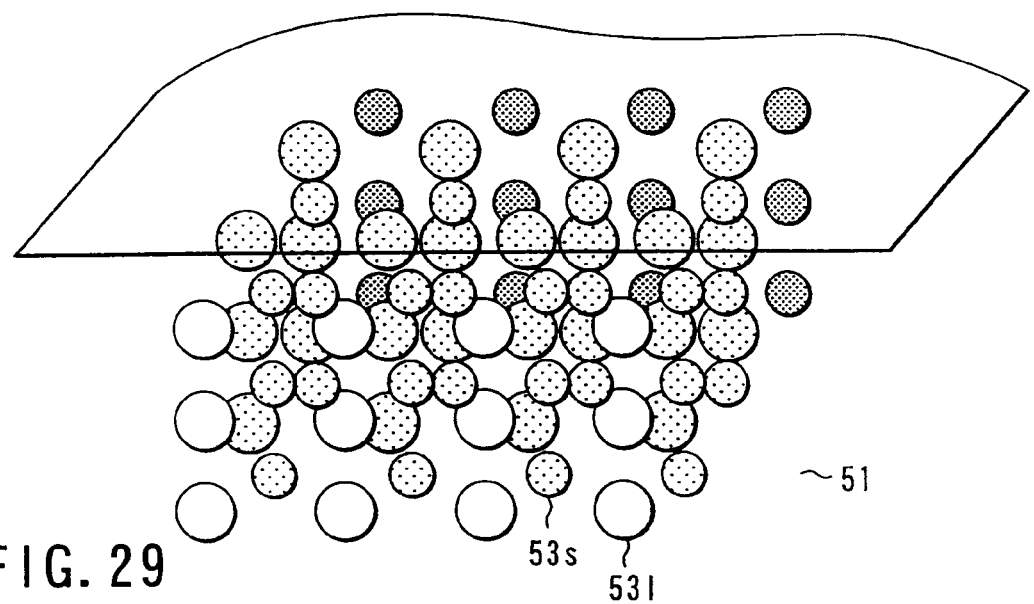
FIG. 29 is a schematic view of a three-dimensional cyclic structure of an eleventh embodiment of the present invention.

FIG. 29 is a schematic view of a three-dimensional cyclic structure (photonic crystal) of the eleventh embodiment of the present invention. The eleventh embodiment is different from the tenth embodiment in that an empty space 53s and an empty space 53I having sizes (diameters) different from each other are cyclically arranged in a silicon substrate 51.

Specifically, a plurality of empty spaces 53s or empty spaces 53I having the same size (shown so that color density slowly increases in the depth direction) are respectively arranged on the same line at equal intervals in the depth direction of a substrate, and a plurality of empty spaces 53s and a plurality of empty spaces 53I having sizes different from each other are arranged like a grid in the same plane in the substrate.

Then, a method for fabricating the three-dimensional cyclic structure of this embodiment is described below by referring to FIGS. 30A to 30C and FIGS. 31A to 31C.

Figures 30A, 31B:
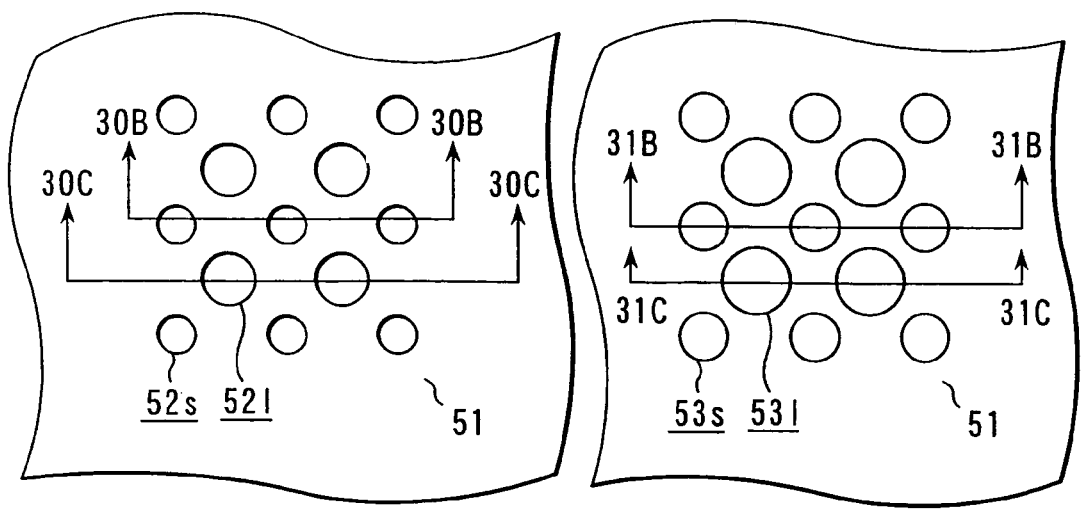
Figures 30B, 31B:
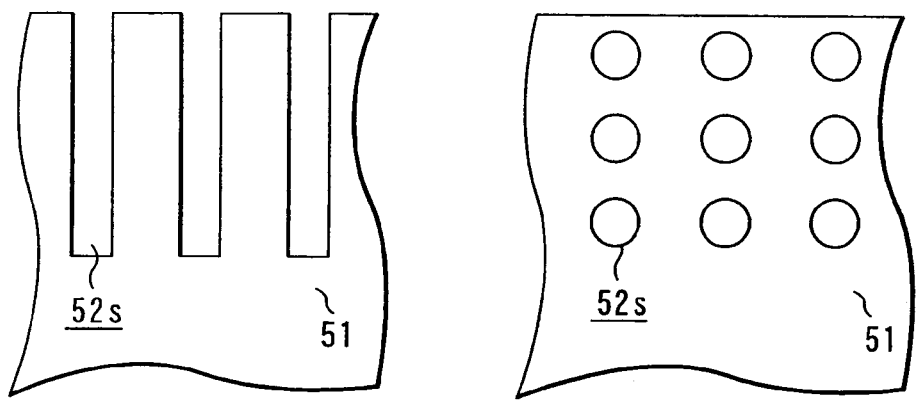
Figures 30C, 31C:
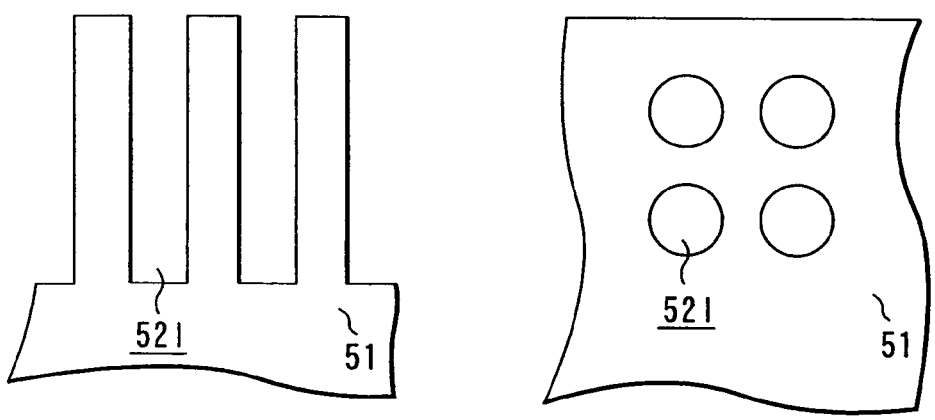

First, as shown in FIGS. 30A to 30C, a mask pattern (not illustrated) comprising an oxide film or the like is formed on the silicon substrate 51 and the silicon substrate 51 is etched by using the mask pattern as a mask to arrange the trenches 52s and trenches 52I having opening diameters different from each other like a grid. Thereafter, the mask pattern is removed.

Then, as shown in FIGS. 31A to 31C, spherical empty spaces 53s or empty spaces 53I having the same size are cyclically arranged in the silicon substrate 51 in the depth direction by applying high-temperature reduced-pressure heat treatment to the silicon substrate 51 on which the trenches 52s and 52I are arranged in a non-oxidizing atmosphere and an empty space pattern is formed in which the empty spaces 53a and empty spaces 53I having sizes-different from each other are alternately cyclically arranged in the direction vertical to the depth direction. As described for the tenth embodiment, it is also permitted to perform heat treatment without removing the mask pattern.

The silicon substrate 51 having the empty space pattern thus obtained can be regarded as photonic crystal capable of controlling light similarly to the case of the tenth embodiment and operated as an optical element.

This embodiment also makes it possible to control the cycle of, that is, the operating wavelength of an empty space in accordance with the method used for the tenth embodiment. Moreover, because this embodiment uses the empty spaces 52s and 52I having sizes different from each other, it is possible to control more operating wavelengths by using the difference between sizes of the empty spaces.

When forming the empty spaces 52, 52s, and 52I through heat treatment in an atmosphere containing hydrogen for the tenth and eleventh embodiments, hydrogen is left in these empty spaces. Moreover, according to the study by the present inventors, it is confirmed that the empty spaces 52, 52s, and 52I are respectively constituted of a polyhedron whose corners are rounded. More accurately, they are respectively constituted of a polyhedron having a predetermined plane orientation.

Furthermore, the following are found as a result of examining angles formed between orientations of planes constituting a polyhedron on one hand and plane (100) which is the principal plane of a silicon substrate on the other. That is, it is clarified that planes constituting a polyhedron are constituted of a {100}-plane group, {110}-plane group, {111}-plane group, {311}-plane group, {531}-plane group, and {541}-plane group. Because these plane groups have a low surface energy, it can be said that the above empty spaces are thermally stable.

TWELFTH EMBODIMENT

An embodiment obtained by applying the ESS art of the present invention to an optical integrated circuit, particularly an embodiment obtained by applying the ESS art to an optical waveguide are described below.

In the case of the optical integrated circuit art, an optical element such as an optical passive component or a luminous element is formed on a semiconductor substrate such as an Si substrate or GaAs substrate and an optical waveguide is formed by mainly containing quartz ($SiO_2$) separately from an optical element. Therefore, it is necessary to inevitably propagate light in a semiconductor region at a joint between an optical waveguide and an optical element.

A method of using that Si has a refractive index larger than that of $SiO_2$ is one of the methods for propagating light in a semiconductor region. This method confines light in an Si region by setting the diameter of the optical waveguide formed of Si to approx. 5 μm which is approx. several times of the wavelength of the light and totally reflecting the light at the interface between the optical waveguide and its surrounding Si region (Si/$SiO_2$ interface).

In the case of an optical waveguide mainly made of Si, it is preferable that the refractive index of its surrounding material is as low to that of Si as possible. Si has a refractive index of 3.4 while $SiO_2$ has a refractive index of 1.5.

Naturally, vacuum (refractive index of 1) is a medium having a refractive index lower than that of $SiO_2$. Air is actually used a medium instead of vacuum. To use air around an Si region used as an optical waveguide, it is considered to use an SOI substrate. However, it is difficult to actually use the SOI substrate.

This is because, though it is possible to easily form a pattern having an upper face and a side face from which Si is exposed by etching an Si region of an SOI substrate, it is difficult to etch the $SiO_2$ region of the SOI substrate and selectively remove only the $SiO_2$ region below the pattern.

Figure 32:
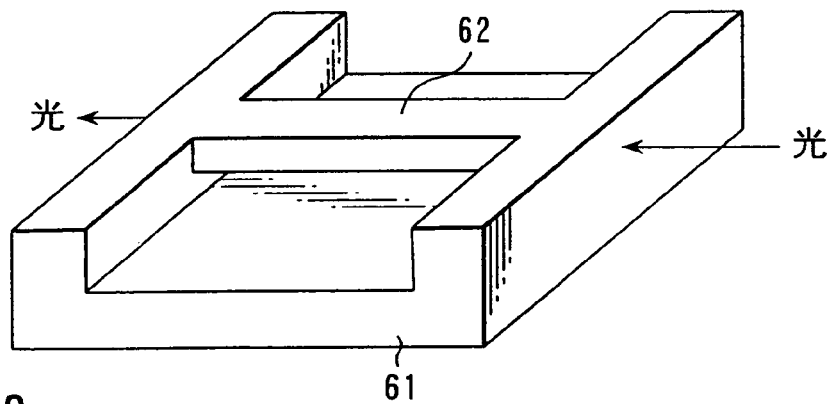
FIG. 32 is a perspective view showing an optical waveguide of a twelfth embodiment of the present invention.

FIG. 32 is a perspective view showing an optical waveguide of the twelfth embodiment of the present invention. In FIG. 32, symbol 61 denotes a single-crystal silicon substrate having a plane orientation (100). An Si pattern 62 with the surroundings of its upper face, side face, and bottom face filled with air is formed on the silicon substrate 61.

The Si pattern 62 and its surrounding air constitute an optical waveguide. A wavelength of 1.4 μm propagates in the optical waveguide. In the case of an actual optical circuit, one end of the Si pattern 62 connects with a light-emitting portion of a not-illustrated optical functional element and the other end of it connects with a light-receiving portion of the not-illustrated optical function element.

It is possible to easily form the above optical waveguide in accordance with the above-described ESS art. First, a plurality of trenches are formed on the surface of the silicon substrate 61 through the publicly-known lithography and RIE. Then, a large-area empty space (ESS) is formed in the silicon substrate 61 by causing the surface migration of silicon through high-temperature heat treatment in an reduction atmosphere. Then, portions not used as the Si pattern 62 in a silicon region (SON layer) on an empty space of the silicon substrate are selectively removed through the publicly-known lithography and RIE.

Figure 33:
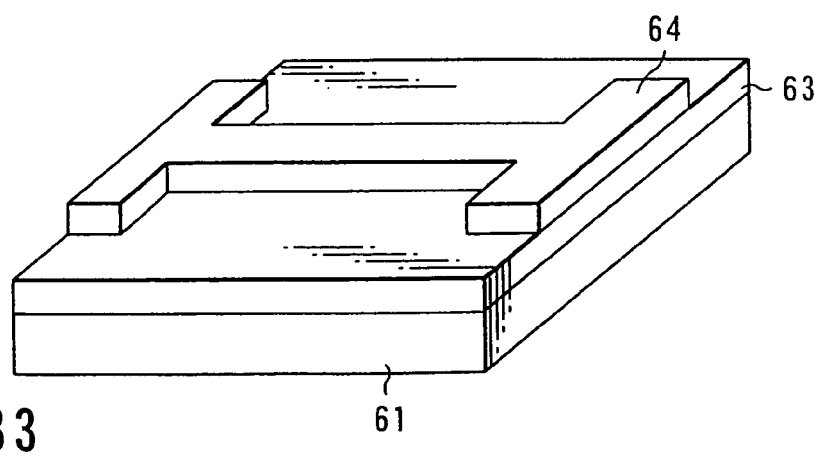
FIG. 33 is a perspective view showing a conventional optical waveguide.

FIG. 33 shows a perspective view of an optical waveguide using a conventional SOI substrate. In FIG. 33, symbol 61 denotes a silicon substrate, 63 denotes an $SiO_2$ layer, and 64 denotes an Si pattern formed by machining a silicon substrate. Air is present at the surroundings of the upper face and side face of the conventional Si pattern 64 similarly to the case of the Si pattern 62 of the present invention but the bottom face of the Si pattern 62 is constituted of the $SiO_2$ layer 63 differently from the case of the Si pattern 62 of the present invention. The refractive index (=1.5) of $SiO_2$ is larger than that of air (=1.0).

Therefore, in the case of the optical waveguide of the present invention shown in FIG. 32, the quantity of light to be leaked to the outside is overwhelmingly small compared to the case of the conventional optical waveguide shown in FIG. 33 and therefore, it can be said that the optical waveguide of the present invention has a superior characteristic (light-confining characteristic).

As described above, this embodiment makes it possible to realize an optical waveguide having a preferable light-confining characteristic and as a result, makes it possible to realize an optical integrated circuit having less light loss.

THIRTEENTH EMBODIMENT

A passive component such as an inductor or capacitor is formed on a semiconductor substrate the same as an active component such as a transistor is. A parasitic capacitance and a parasitic resistance (eddy-current loss) between an active component and a semiconductor substrate are large.

Therefore, in the case of a conventional inductor or capacitor, when the frequency of a signal passing through the inductor or capacity reaches a high frequency of 1 GHz or more, the following problem occurs. That is, Q-value decreases in the case of an inductor and it is difficult to obtain a high-accuracy capacitance in the case of a capacitor.

To solve the above problems, the present invention uses a silicon substrate having a flat empty space as a semiconductor substrate to form an passive component on a silicon substrate on the flat empty space. This configuration makes it possible to effectively decrease the parasitic capacitance and parasitic resistance between the passive component and the semiconductor substrate and solve the above problems.

Figure 34A:
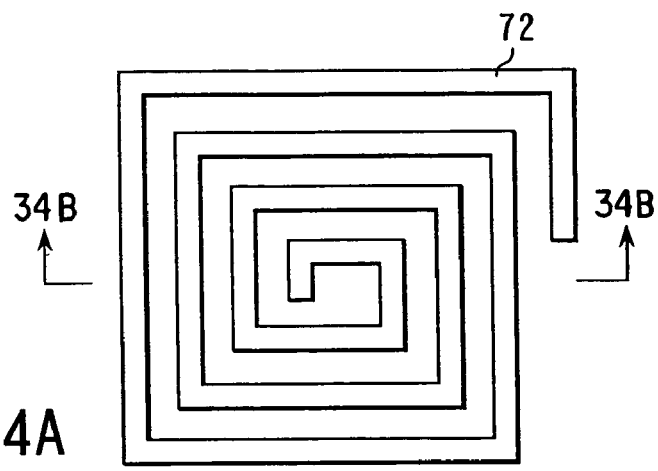
FIGS. 34A and 34B are a top view and a sectional view of a semiconductor device of a thirteenth embodiment of the present invention having an inductor.
Figure 34B:
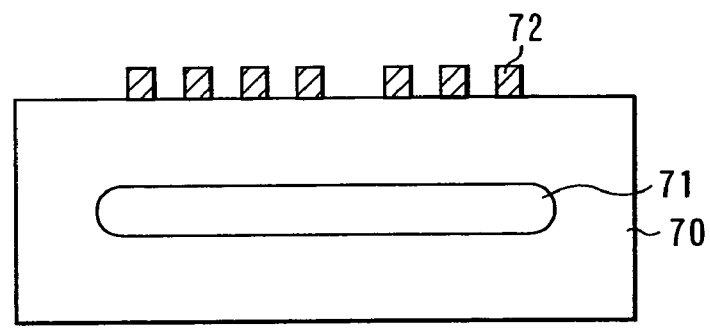
Figure 35:
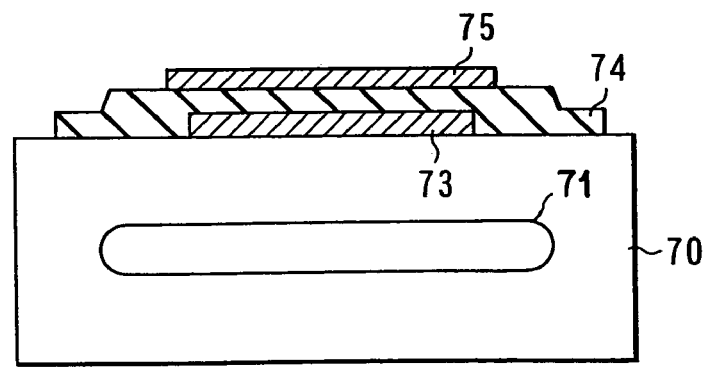
FIG. 35 is a sectional view of a semiconductor device of the thirteenth embodiment of the present invention having a capacitor.

FIGS. 34A and 34B show a top view and a sectional view of a semiconductor device having an inductor to which the present invention is applied. Moreover, FIGS. 35A and 35B show sectional views of a semiconductor device having an MIM capacitor to which the present invention is applied. In FIGS. 35A and 35B, symbol 70 denotes a silicon substrate, 71 denotes a flat empty space (ESS), 72 denotes a spiral inductor, 73 denotes a metal electrode, 74 denotes an insulating film, and 75 denotes a metal electrode. It is also permitted to form an inductor and a capacitor on the silicon substrate 70.

It is permitted to use any one of the forming methods of the above embodiments as the method for forming the silicon substrate 70 having the flat empty space 71. After the silicon substrate 70 is formed, a passive component such as an inductor, an active component such as a transistor, and a wiring layer are formed as ever. The passive-component is formed after the empty space 71 is formed because high-temperature heat treatment is necessary to form the empty space 71.

FOURTEENTH EMBODIMENT

In recent years, a device and a module have been improved in density and function in the semiconductor field. However, the amount of heat produced by a device or the like has increased because of improvement of density and function and thereby, it has been very difficult to release heat.

As one of the conventional heat release methods, a method is known in which a heat-release fin is set to a device or package, heat from the device or the like is transmitted to the fin in accordance with heat conduction, and the heat from the fin is released into air. However, when the produced amount of heat increases as described above, a sufficient heat-release effect is not obtained. Therefore, downsizing of the whole unit or heat release by forced air cooling (by fan) has been the mainstream. However, it is still difficult to obtain a necessary heat-release effect.

In the case of a main frame such as a supercomputer, cooling by a coolant such as liquid nitrogen or flon is the mainstream. It is also considered to apply the above cooling method to a semiconductor device or the like. However, a problem occurs that a terminal or wiring is corroded due to impurities present in the coolant.

To solve the above problem, the present invention uses a silicon substrate including a plurality of cooling pipes for circulating a coolant as a semiconductor substrate. This configuration makes it possible to solve the problem of heat release because a silicon substrate can be effectively cooled by circulating a coolant through a cooling pipe even if the amount of heat produced by a device or the like is increased due to improvement of density or function. Moreover, because the coolant circulates through a substrate on which a terminal or the like is not present, a problem of corrosion does not occur.

Figure 36:
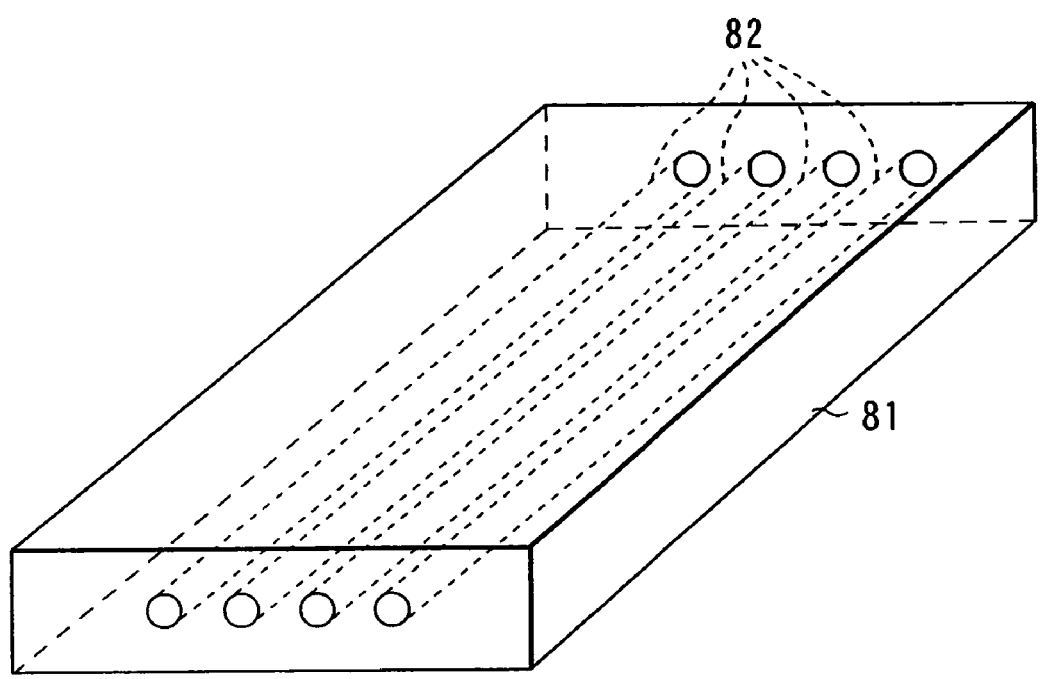
FIG. 36 is a perspective view of a silicon substrate of a fourteenth embodiment of the present invention having a cooling pipe.

FIG. 36 shows a perspective view of a silicon substrate having a cooling pipe (cooling structure) of the fourteenth embodiment of the present invention. In FIG. 36, symbol 81 denotes a silicon substrate and 82 denotes a cooling pipe. To cool the silicon substrate, a not-illustrated coolant supply mechanism is prepared.

Figure 37:
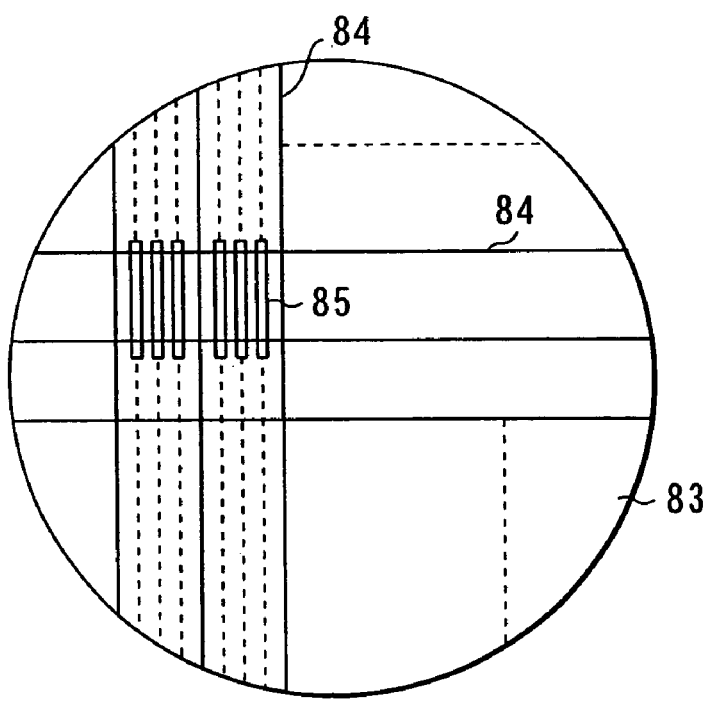
FIG. 37 is a top view of the silicon substrate of the fourteenth embodiment of the present invention having the cooling pipe.

Then, a method for fabricating the semiconductor device of this embodiment having a cooling pipe is described below by referring to FIG. 37.

First, an Si wafer 83 is prepared. In FIG. 37, symbol 84 denotes a scribe line.

Then, a plurality of flat empty spaces (hollow structure) 85 are formed by the ESS art of the present invention so as to be orthogonal to the scribe line 84. To form the flat empty space 85, it is permitted to use any one of the forming methods of the above-described embodiments. It is preferable to design a pattern of a plurality of trenches so that a cylindrical empty space 85 is formed.

Thereafter, necessary elements and wirings are formed on a silicon region on the empty space 85 of an Si wafer in accordance with a publicly-known method to form a plurality of semiconductor devices (not illustrated) having desired functions on the Si wafer 83.

Finally, the Si wafer is cut along the scribe line 84 in accordance with a publicly-known method to take out a plurality of chips from one Si wafer 83. In this case, because the empty space 85 is cut, a cooling pipe is completed at the same time.

FIFTEENTH EMBODIMENT

Figure 38A:
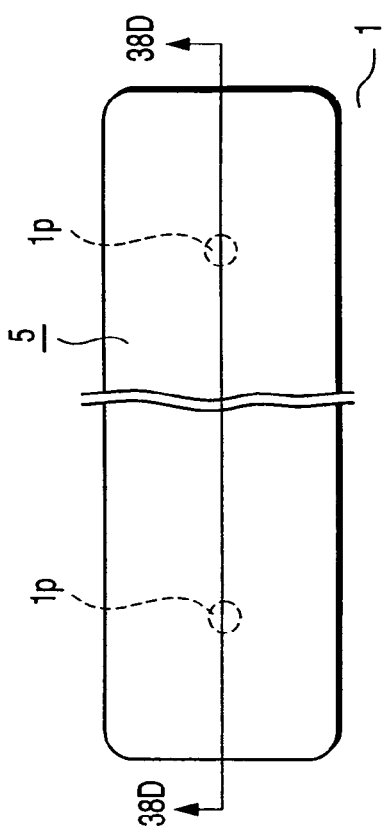
FIGS. 38A to 38E are sectional views of an SON substrate according to the fifteenth embodiment of the invention.
Figure 38C:
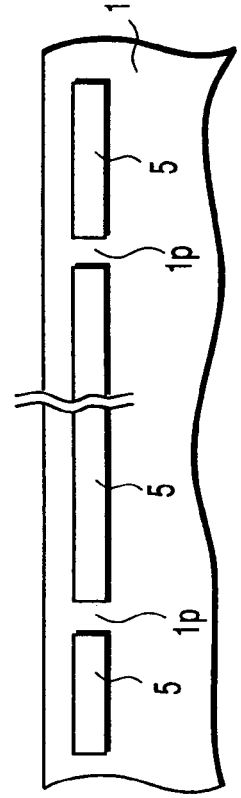
Figure 38B:
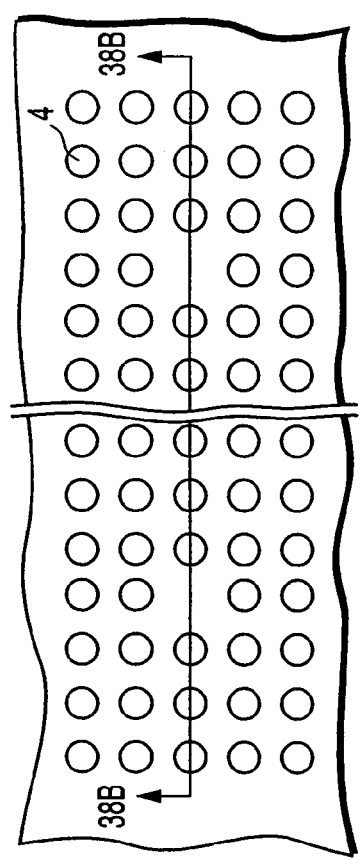
Figure 38D:
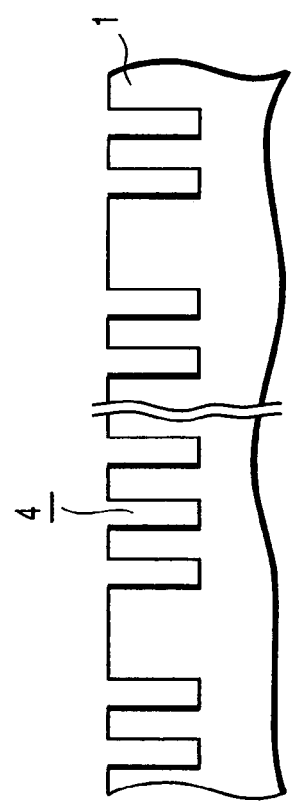
Figure 38E:
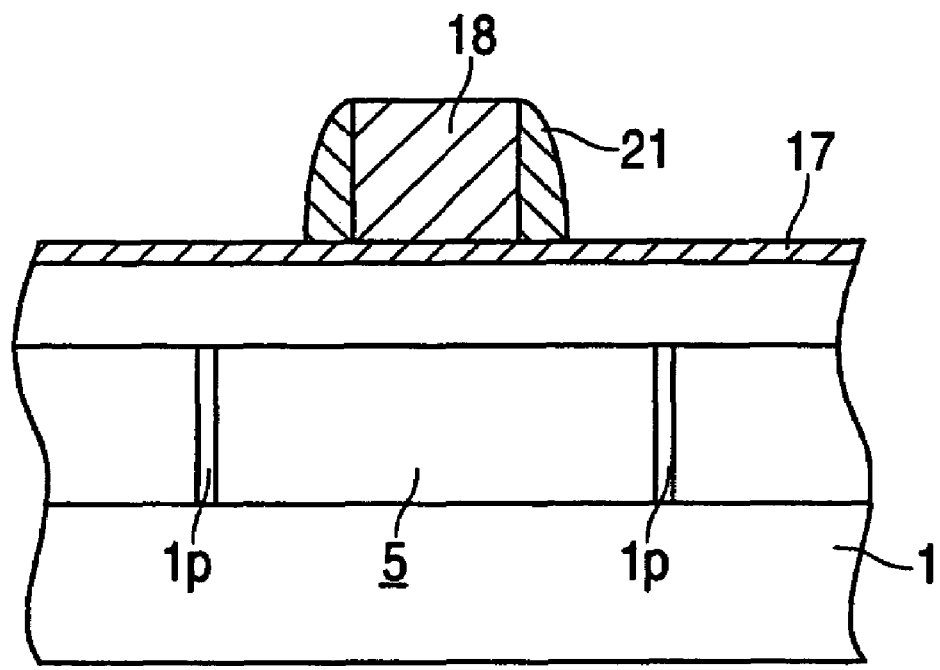

The technique of preventing a flat ESS from collapsing, employed in the fifteenth embodiment, differs from those used in the sixth and seventh embodiments. The technique resides in forming Si pillars in the ESS, which prevent the ESS from collapsing. How the Si pillars are formed will be explained, with reference to FIGS. 38A to 38D. FIG. 38E illustrates a semiconductor element formed on the ESS provided with Si pillars.

First, a mask layer, e.g., oxide film, is formed on a silicon substrate 1. A photoresist pattern is formed on the mask layer. The mask layer may be of the same type as used in the first embodiment.

Next, the mask layer is patterned by means of anisotropic etching, e.g., RIE, using the photoresist pattern as the mask. The pattern of the photoresist mask is thereby transferred to the mask layer.

The photoresist pattern is carbonized and peeled off. Using the mask layer thus patterned, as the mask, anisotropic etching, e.g., RIE, is performed on the silicon substrate 1. A plurality of trenches 4 are thereby made in the surface of the substrate 1, in rows and columns as shown in FIG. 38A. As shown in FIGS. 38A and 38B, no trenches are made in those parts of the substrate 1 that will become Si pillars.

More precisely, one trench is not made in each part of the substrate 1, which will be a Si pillar. Instead, two or more trenches may not be made in that part of the substrate 1, thereby to make a larger Si pillar.

The mask layer is removed. Thereafter, the silicon substrate 1 is annealed at high temperature in a reducing atmosphere of reduced pressure. A flat empty space (ESS) 5 is thereby provided in the silicon substrate 1, and two Si pillars $1p$ are formed in the space 5, as is illustrated in FIGS. 38C and 38D.

How the Si pillars $1p$ should be arranged to prevent the ESS 5 from collapsing will be explained. The Si pillars $1p$ are made to prevent the ESS 5 from collapsing due to the difference between the pressure inside the ESS 5 and the pressure outside the ESS 5, while and after the ESS 5 is being formed.

Figure 39:
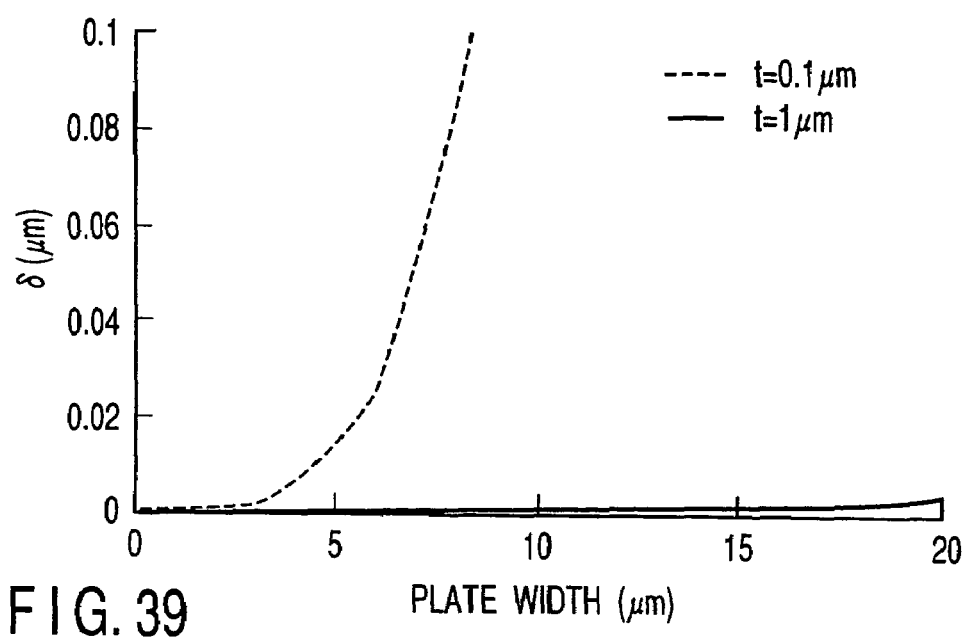
FIG. 39 is a graph representing the relation between the thickness and deflection of the silicon substrate provided on an ESS.

The inventors hereof examined the relation between the thickness t of the silicon substrate above the empty space 5 (simply describes the silicon layer later) and deflection δ of the silicon layer above the ESS 5. The thickness t was 0.1 μm for one sample, and 1 μm for another. The results are shown in FIG. 39. As seen from FIG. 39, the thinner the silicon layer, the greater the deflection δ.

It was studied to see how much the silicon pillars should be spaced in consideration of the thickness of the silicon layer, calculating the deflection δ the silicon layer may have. It is known that no problems will arise if the deflection δ is equal to or less than half the thickness t of the silicon layer. In view of this, it was found that the Si pillars $1p$ should be arranged to satisfy the following inequality describing the width w of the silicon layer:

$$w \leq t(E/0.0568P)^{1/4} \qquad (3)$$

where E is Young's modulus of silicon (=0.13(N/μm²)), and P is the load (pressure) (N/μm²) applied on the silicon layer.

For a silicon layer having a thickness of 0.2 μm, the Si pillars $1p$ must be spaced by 6.9 μm less than calculated by the inequality (3), in order to prevent the ESS 5 from collapsing.

Thus, even if the silicon layer is thin, the Si pillars $1p$ can reliably prevent the ESS 5 from collapsing due to, as described above, the difference between the pressures inside and outside the ESS 5. This helps to provide a SON substrate that has a large ESS. In addition, this enhances the freedom of designing a SON substrate.

Figure 40A:
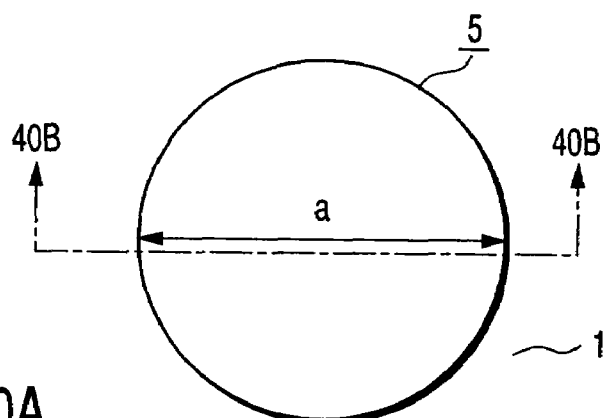
FIGS. 40A and 40B show an SON substrate having an empty space 5 which looks circular as viewed from above the SON substrate.
Figure 40B:
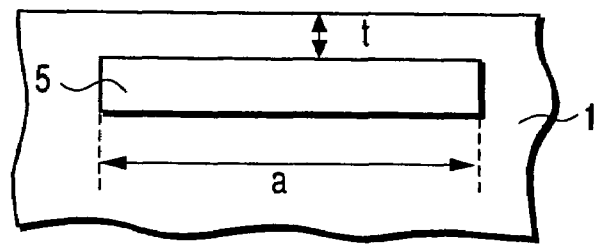

The inventors estimated the deflection of the silicon layer of an SON substrate having a flat empty space (ESS) 5 that looked circular as viewed from above the SON substrate as shown in FIGS. 40A and 40B. The largest deflection took place at the center of the circular ESS 5. The deflection δ is given as follows:

$$\delta = 0.0108 P \cdot a^4 / (E \cdot t^3) \quad (4)$$

where a (μm) is the diameter of the circular ESS 5, and t (μm) is the thickness of the silicon layer.

The deflection δ of the silicon layer of the SON substrate shown in FIGS. 40A and 40B will be compared with that of an SON substrate that has a flat empty space (ESS) that looks rectangular as viewed from above the SON substrate.

The maximum deflection of a silicon disc having a diameter equal to either short side of the rectangular silicon plate is three eighths (⅜) of the maximum deflection of the rectangular silicon plate. Hence, the silicon disc will have the same deflection as the rectangular silicon plate if its diameter increases 1.27 times. In the case of the rectangular silicon plate, the maximum deflection will not increase even its longer sides are lengthened. This means that the SON substrate can have a rectangular empty space that is larger than a circular empty space that can be made in the SON substrate.

SIXTEENTH EMBODIMENT

FIGS. 41A and 41B shows a pressure sensor incorporated in the sixteenth embodiment of this invention.

As shown in FIGS. 41A and 41B, the sixteenth embodiment comprises an n-type SON substrate 91, an empty space 92, p-type diffusion layers $93_1$ to $93_4$, a p+-type diffusion layer 94, and metal wires 95. The major surface of the SON substrate 91 is a [100] face. The empty space 92 is made in the SON substrate 91 and looks rectangular as viewed from above the SON substrate 91. The p-type diffusion layers $93_1$ to $93_4$ are formed in the surface of the substrate 91, more precisely in one side thereof. The diffusion layers $93_1$ to $93_4$ serve as gauge resistors that constitute a bridge circuit. The metal wires 95 is formed as a wire in the surface of the substrate and has a high impurity concentration. The metal wires 95 are made of aluminum or the like. They are connected to the metal wires 95, extending through connection holes made in the insulating film (not shown) provided on the SON substrate 91.

The pressure sensor is a diaphragm-type semiconductor sensor. It is designed to detect the pressure applied on the silicon layer, i.e., that part of the SON substrate 91 which lies above the empty space 92. The pressure sensor performs its function because the silicon layer deflects due to the difference between the pressures inside and outside the space 92. When the silicon layer deflects due to the pressure difference, the p-type diffusion layers $93_1$ to $93_4$ have their resistances (gauge resistances) changed. The bridge circuit generates an electric signal that corresponds to the change of the resistances. Thus, the pressure on the silicon layer can be measured.

Since an vacuum is generated in the empty space 92, the pressure the pressure sensor detects is an absolute pressure. The pressure on the silicon layer may be measured, with the atmospheric pressure utilized as the reference. To this end, as shown in FIG. 42, the lower layer of the n-type SON substrate 91 may have a hole 96 that communicates with the empty space 92.

The deflection of the silicon layer can be varied by changing the thickness and size of the silicon layer. The range over which the pressure sensor can measure pressures can be adjusted by changing the thickness and size of the silicon layer. That is, a pressure sensor capable of measuring pressures falling within a desired range can be provided, by selecting appropriate thickness and size for the silicon layer.

Figure 43A:
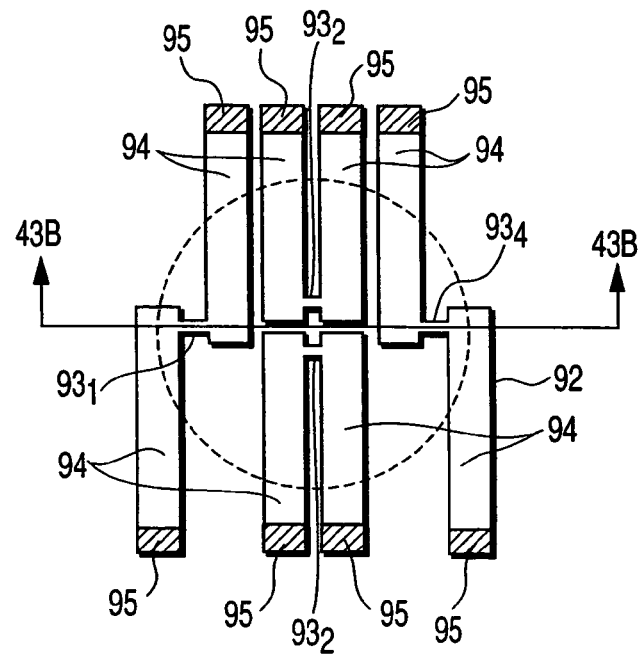
FIGS. 43A and 43B depict another modification of the pressure sensor, for use in the sixteenth embodiment.
Figure 43B:
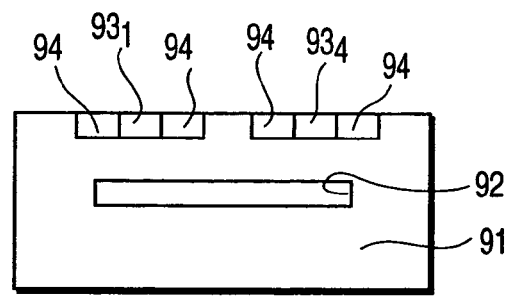
Figure 44:
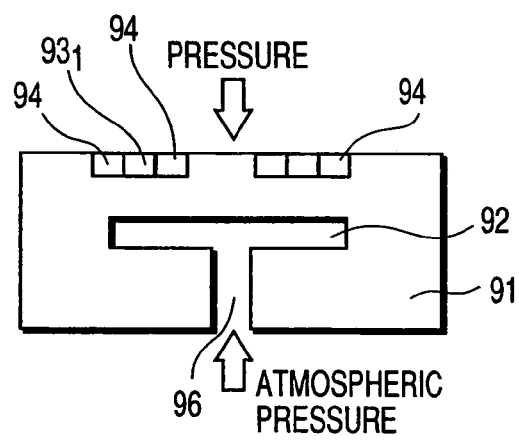
FIG. 44 shows another modification of the sensor, for use in the sixteenth embodiment.

FIGS. 43A and 43B shows a modification of the pressure sensor. The modified pressure sensor is designed, utilizing an n-type substrate 91 having a {110} major surface. The silicon layer of an SON substrate whose major surface is a {110} face has its resistance to a different degree due to its anisotropy and its piezoresistance effect, from the silicon layer of an SON substrate whose major surface is a {100} face, even it deflects to the same extent. The modified sensor shown in FIGS. 43A and 43B has p-type diffusion layers $93_1$ to $93_4$, which are arranged in a specific pattern shown in FIG. 44, thereby increasing the pressure-sensitivity (i.e., the change in resistance due to the piezoresistnace effect).

The present invention is not restricted to the above embodiments. For the above embodiments, a case is described in which a silicon substrate is used. However, the present invention is effective for other semiconductor substrate such as a silicon germanium substrate. That is, the present invention makes it possible to provide an inexpensive high-reliability SOI (Semiconductor On Insulator) structure not restricted to silicon.

In the case of the above embodiments, a plurality of trenches 2 two-dimensionally arranged are changed to one flat empty space. However, the same function and advantage can be also obtained by changing a plurality of stripe-like trenches one-dimensionally arranged to one flat empty space through heat treatment.

Moreover, it is possible to realize more high speed and more power saving by using a Cu wiring in addition to an SOI structure of the present invention.

In the embodiment described above, the initial trench has a cross section having straight sides. That is, the trench 4 has a width that does not change in the direction of depth. Instead, the initial trench 4 may be replaced by a bottle-shaped one, i.e., one having the smallest sectional area not at the bottom, but at somewhere between the top and bottom. Like the trench 4, the bottle-shaped trench can effectively serve to provide a flat empty space.

Furthermore, various modifications of the present invention are permitted as long as they are not deviated from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor substrate fabrication method comprising the steps of:
    forming a plurality of first trenches on a surface of a semiconductor substrate, the plurality of first trenches being arranged in a two-dimensional array, the array being parallel to the surface; and
    changing the first trenches to one flat empty space by applying heat treatment to the semiconductor substrate.

2. The semiconductor substrate fabrication according to claim 1, further comprising the steps of:
    forming the flat empty space and thereafter forming a second, trench reaching the flat empty space on the surface of the semiconductor substrate; and
    filling insides of the second trench and the flat empty space with an insulating film.

3. The semiconductor substrate fabrication method according to claim 1, wherein the flat empty space is formed and thereafter, an oxide film is formed in the flat empty space through thermal oxidation.

4. The semiconductor substrate fabrication method according to claim 2, wherein the flat empty space is formed and thereafter, an oxide film is formed in the flat empty space through thermal oxidation.

5. The semiconductor substrate fabrication method according to claim 1, wherein, when assuming the interval between the first trenches as D and the radius of a circle having an area same as the area of the opening face of each first trench as R, the first trenches are arranged so as to be D<4R.

6. The semiconductor substrate fabrication method according to claim 2, wherein, when assuming the interval between the first trenches as D and the radius of a circle having an area same as the area of the opening face of each first trench as R, the first trenches are arranged so as to be D<4R.

7. The semiconductor substrate fabrication method according to claim 3, wherein, when assuming the interval between the first trenches as D and the radius of a circle having an area same as the area of the opening face of each first trench as R, the first trenches are arranged so as to be D<4R.

8. The semiconductor substrate fabrication method according to claim 4, wherein, when assuming the interval between the first trenches as D and the radius of a circle having an area same as the area of the opening face of each first trench as R, the first trenches are arranged so as to be D<4R.

9. The semiconductor substrate fabrication method according to claim 1, wherein the first trenches respectively have an aspect ratio of 2.5 or more.

10. The semiconductor substrate fabrication method according to claim 2, wherein the first trenches respectively have an aspect ratio of 2.5 or more.

11. The semiconductor substrate fabrication method according to claim 3, wherein the first trenches respectively have an aspect ratio of 2.5 or more.

12. The semiconductor substrate fabrication method according to claim 4, wherein the first trenches respectively have an aspect ratio of 2.5 or more.

13. The semiconductor substrate fabrication method according to claim 1, further comprising the step of forming a MOS transistor in a semiconductor region on the empty space of the semiconductor substrate.

14. The semiconductor substrate fabrication method according to claim 2, further comprising the step of forming a MOS transistor in a semiconductor region on the empty space of the semiconductor substrate.

15. The semiconductor substrate fabrication method according to claim 3, further comprising the step of forming a MOS transistor in a semiconductor region on the empty space of the semiconductor substrate.

16. The semiconductor substrate fabrication method according to claim 4, further comprising the step of forming a MOS transistor in a semiconductor region on the empty space of the semiconductor substrate.

17. The semiconductor substrate fabrication method according to claim 5, further comprising the step of forming a MOS transistor in a semiconductor region on the empty space of the semiconductor substrate.

18. The semiconductor substrate fabrication method according to claim 6, further comprising the step of forming a MOS transistor in a semiconductor region on the empty space of the semiconductor substrate.

19. The semiconductor substrate fabrication method according to claim 7, further comprising the step of forming a MOS transistor in a semiconductor region on the empty space of the semiconductor substrate.

20. The semiconductor substrate fabrication method according to claim 8, further comprising the step of forming a MOS transistor in a semiconductor region on the empty space of the semiconductor substrate.

21. The semiconductor substrate fabrication method according to claim 9, further comprising the step of forming a MOS transistor in a semiconductor region on the empty space of the semiconductor substrate.

22. The semiconductor substrate fabrication method according to claim 10, further comprising the step of forming a MOS transistor in a semiconductor region on the empty space of the semiconductor substrate.

23. The semiconductor substrate fabrication method according to claim 11, further comprising the step of forming a MOS transistor in a semiconductor region on the empty space of the semiconductor substrate.

24. The semiconductor substrate fabrication method according to claim 12, further comprising the step of forming a MOS transistor in a semiconductor region on the empty space of the semiconductor substrate.

25. The method according to claim 1, wherein the first trench has a smallest sectional area in a plane perpendicular to the direction of the depth of the first trench.

26. A semiconductor substrate fabrication method comprising the steps of:
    forming a plurality of first trenches on a surface of a semiconductor substrate, the plurality of first trenches being arranged in a two-dimensional array, the array being parallel to the surface;
    changing the first trenches to one flat empty space by applying heat treatment to the semiconductor substrate;
    forming a second trench reaching the empty space on the semiconductor substrate; and
    forming a thermal oxide film for generating a tensile stress in the semiconductor substrate on the empty space on inner faces of the empty space and the second trench through thermal oxidation.

* * * * *